US012255586B2

United States Patent
Abouzied et al.

(10) Patent No.: US 12,255,586 B2
(45) Date of Patent: Mar. 18, 2025

(54) OSCILLATOR FEEDTHROUGH CALIBRATION

(71) Applicant: Qualcomm Incorporated, San Diego, CA (US)

(72) Inventors: Mohamed Abouzied, La Jolla, CA (US); Chuan Wang, San Diego, CA (US); Anosh Davierwalla, San Diego, CA (US); Muhammad Hassan, San Diego, CA (US); Vinod Panikkath, San Diego, CA (US); Li Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 31 days.

(21) Appl. No.: 18/060,295

(22) Filed: Nov. 30, 2022

(65) Prior Publication Data

US 2024/0178795 A1    May 30, 2024

(51) Int. Cl.
*H03D 7/14* (2006.01)
*H04B 17/21* (2015.01)

(52) U.S. Cl.
CPC .......... *H03D 7/1491* (2013.01); *H04B 17/21* (2015.01)

(58) Field of Classification Search
CPC ......... H03L 7/00; H04L 27/20; H04L 7/0058; H04L 7/0087; H04L 7/02; H04L 7/0331
See application file for complete search history.

(56) References Cited

U.S. PATENT DOCUMENTS

| 7,358,885 | B2 | 4/2008 | Maxim et al. |
| 2009/0179695 | A1 | 7/2009 | Siprak et al. |
| 2013/0039438 | A1 | 2/2013 | Oliaei et al. |
| 2022/0045646 | A1 | 2/2022 | Dey et al. |

FOREIGN PATENT DOCUMENTS

| CN | 110662977 B | 10/2022 |
| EP | 0951138 A1 | 10/1999 |

OTHER PUBLICATIONS

Giannini V., et al., "A 2-mm 0.1-5 GHz Software-Defined Radio Receiver in 45-nm Digital CMOS", IEEE Journal of Solid-State Circuits, vol. 44, No. 12, Dec. 2009, pp. 3486-3498.
Partial International Search Report—PCT/US2023/078196—ISA/EPO—Feb. 20, 2024, 10 pages.
Hsia K., "TI Designs High Speed: CerTIfied Design TSW308x Wideband Digital to RF Transmit Solution", Texas Instruments, Sep. 2013, 31 pages.

(Continued)

*Primary Examiner* — Diana J. Cheng

(57) ABSTRACT

An apparatus is disclosed for oscillator feedthrough calibration, such as a component arrangement that can be calibrated to account for signal leakage from an oscillator coupled to a mixer circuit. In example aspects, the apparatus includes a mixer circuit having a first stage, a second stage, and tuning circuitry. The first stage includes at least one transistor coupled between a mixer input and a mixer output. The second stage includes one or more transistors coupled between the at least one transistor of the first stage and the mixer output. The one or more transistors are also coupled between a local oscillator signal input and the mixer output. The tuning circuitry includes at least one current source coupled to the at least one transistor of the first stage.

24 Claims, 10 Drawing Sheets

(56) References Cited

OTHER PUBLICATIONS

Lee C.P., et al., "A Highly Linear Direct-Conversion Transmit Mixer Transconductance Stage with Local Oscillation Feedthrough and I/Q Imbalance Cancellation Scheme", 2006 IEEE International Solid-State Circuits Conference, Feb. 6-9, 2006, 10 Pages.
O'Sullivan C., et al., "Carrier Leak Calibration Scheme on a 0.18 μm Transmitter", Jun. 2010, 6 Pages.
O'Sullivan C., "Local Oscillator Feedthrough Suppression Using On-Chip Calibration Techniques", Dec. 23, 2021, 5 pages.
Pang J., et al., "A 128-QAM 60GHz CMOS Transceiver for IEEE802.11ay with Calibration of LO Feedthrough and I/Q Imbalance", 2017 IEEE International Solid-State Circuits Conference, ISSCC 2017, Session 24, Wireless Receivers and Synthesizers, 24.9, pp. 424-426.
Wang Y., et al., "A 39-GHz 64-Element Phased-Array Transceiver with Built-In Phase and Amplitude Calibrations for Large-Array 5G NR in 65-nm CMOS", Apr. 2020, pp. 1-21.
Giannini V., et al., "A 2-mm2 0.1-5 GHz Software-Defined Radio Receiver in 45-nm Digital CMOS", IEEE Journal of Solid-state Circuits, IEEE, USA, vol. 44, No. 12, Dec. 31, 2009, pp. 3486-3498, XP011285559, figure 8.
International Search Report and Written Opinion—PCT/US2023/078196—ISA/EPO—Jul. 1, 2024.

OSCILLATOR FEEDTHROUGH CALIBRATION

TECHNICAL FIELD

This disclosure relates generally to signal communication or signal processing using an electronic device and, more specifically, to circuitry calibration to counteract signal feedthrough from an oscillator coupled to a mixer circuit.

BACKGROUND

Electronic devices include traditional computing devices such as desktop computers, notebook computers, smartphones, wearable devices like a smartwatch, internet servers, and so forth. Electronic devices also include other types of computing devices such as personal voice assistants (e.g., smart speakers), wireless access points or routers, thermostats and other automated controllers, robotics, automotive electronics, devices embedded in other machines like refrigerators and industrial tools, Internet of Things (IoT) devices, medical devices, and so forth. These various electronic devices provide services relating to productivity, communication, social interaction, security, health and safety, remote management, entertainment, transportation, and information dissemination. Thus, electronic devices play crucial roles in modern society.

Many of the services provided by electronic devices in today's interconnected world depend at least partly on electronic communications. Electronic communications can include, for example, those exchanged between two or more electronic devices using wireless or wired signals that are transmitted over one or more networks, such as the Internet, a Wi-Fi® network, or a cellular network. Electronic communications can therefore include wireless or wired transmissions and receptions. To transmit and receive communications, an electronic device can use a transceiver, such as a wireless transceiver that is designed for wireless communications.

Some electronic communications can thus be realized by propagating signals between two wireless transceivers at two different electronic devices. For example, using a wireless transmitter, a smartphone can transmit a wireless signal to a base station over the air as part of an uplink communication to support mobile services. Using a wireless receiver, the smartphone can receive a wireless signal that is transmitted from the base station via the air medium as part of a downlink communication to enable mobile services. With a smartphone, for instance, mobile services can include making voice and video calls, participating in social media interactions, sending messages, watching movies, sharing videos, performing searches, using map information or navigational instructions, finding friends, engaging in location-based services generally, transferring money, obtaining another service like a car ride, and so forth.

Many mobile and other communication-based services depend at least partly on the transmission or reception of wireless signals between two or more electronic devices. Consequently, researchers, electrical engineers, and other designers of electronic devices strive to develop wireless transceivers that can use wireless signals effectively to provide these and other mobile services.

SUMMARY

Local oscillator feedthrough (LOFT) refers to an oscillator signal that "leaks" through a mixer into a communication chain and adversely impacts downstream signals. This document describes devices and techniques that counteract such oscillator signal leakage. To transmit or receive wireless signals, a wireless interface device can include a communication chain (e.g., a transmit or receive chain) that processes a propagating signal. This processing may entail frequency conversion using a mixer. A mixer converts between frequencies using a local oscillator signal from a local oscillator (LO). In described examples, a mixer circuit includes a mixer and tuning circuitry. The tuning circuitry applies a calibration signal to the mixer to counteract LOFT. To determine the calibration signal, the mixer can be operated without receiving an information-carrying input signal. The mixer does, however, receive a LO signal at a particular frequency. A power detector is coupled to a point along the communication chain to detect a power level and provide the power level to controller circuitry. The controller circuitry adjusts the tuning circuitry to produce the calibration signal based on the detected power level. Because the detected power level results from a mixer that has a LO signal input but no information-carrying signal input, the detected power level corresponds to the LOFT. Thus, the controller circuitry adjusts the tuning circuitry to minimize, or at least to reduce, the detected power level to counteract the LOFT. During operation at the same particular frequency, the tuning circuitry applies the calibration signal to the mixer to reduce the LOFT. In these manners, the LOFT can be reduced without relying on expensive external testing equipment and by instead using onboard calibration circuitry. These and other implementations are described herein.

In an example aspect, an apparatus for oscillator feedthrough calibration is disclosed. The apparatus includes a mixer circuit having a first stage, a second stage, and tuning circuitry. The first stage includes at least one transistor coupled between a mixer input and a mixer output. The second stage includes one or more transistors coupled between the at least one transistor of the first stage and the mixer output. The one or more transistors are also coupled between a local oscillator signal input and the mixer output. The tuning circuitry includes at least one current source coupled to the at least one transistor of the first stage.

In an example aspect, an apparatus for oscillator feedthrough calibration is disclosed. The apparatus includes a power detector configured to detect a power level and a communication chain. The communication chain includes a port, a mixer circuit, and an amplifier. The port is configured to be coupled to an antenna. The mixer circuit includes a mixer and tuning circuitry. The mixer is configured to combine a local oscillator signal and an input signal to produce an output signal. The tuning circuitry is coupled between the mixer and the power detector. The tuning circuitry is configured to adjust the output signal based on the power level. The amplifier is coupled between the mixer circuit and the port. The power detector is coupled to the communication chain between the amplifier and the port.

In an example aspect, a method for mixer calibration is disclosed. The method includes operating a mixer to produce an output signal based on an input signal and a local oscillator signal. The method also includes propagating the output signal through one or more components. The method additionally includes adjusting the output signal to produce an adjusted signal using at least one component of the one or more components. The method further includes detecting a power level associated with the adjusted signal to obtain a detected power level. The method also includes calibrating the operating of the mixer based on the detected power level.

In an example aspect, an apparatus for mixer calibration is disclosed. The apparatus includes means for mixing an input signal and a local oscillator signal to produce an output signal. The apparatus also includes means for propagating the output signal along a communication chain. The apparatus additionally includes means for detecting a power level of the output signal based on the means for propagating. The apparatus further includes means for adjusting the output signal to tune the means for mixing based on the power level to decrease a feedthrough of the local oscillator signal.

In an example aspect, an apparatus for oscillator feedthrough calibration is disclosed. The apparatus includes a mixer circuit having a first stage, a second stage, and tuning circuitry. The first stage includes at least one transistor coupled between a mixer input and a mixer output. The at least one transistor includes a gate terminal and a back-gate terminal, with the gate terminal of the at least one transistor corresponding to the mixer input. The second stage includes one or more transistors coupled between the at least one transistor of the first stage and the mixer output. The one or more transistors are also coupled between a local oscillator signal input and the mixer output. The tuning circuitry includes at least one current source coupled to the back-gate terminal of the at least one transistor.

DETAILED DESCRIPTION

Introduction and Overview

Figure 1:
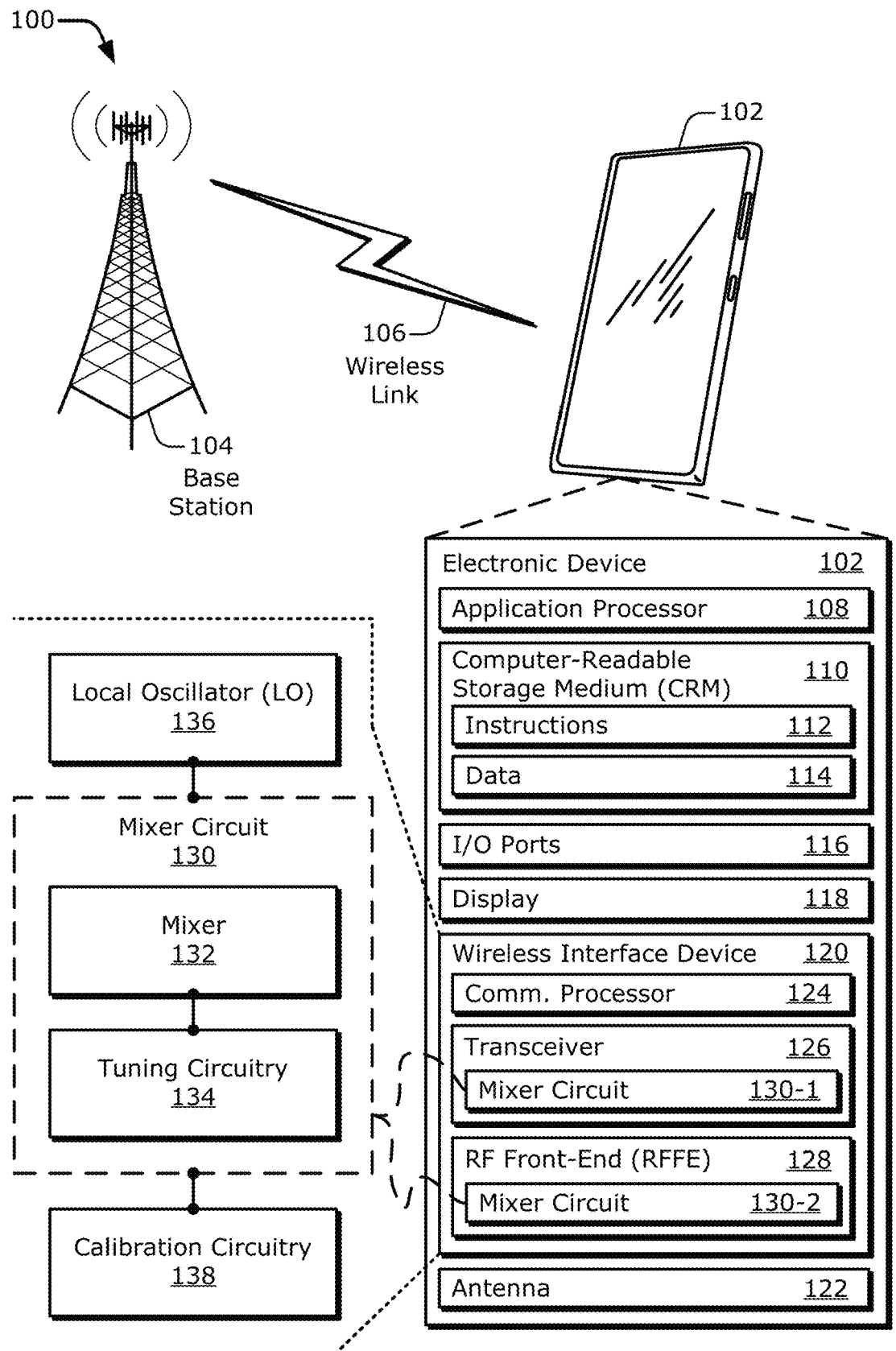
FIG. 1 illustrates an environment with an example electronic device that has a wireless interface device, which includes an example mixer circuit and corresponding calibration circuitry.

To facilitate transmission and reception of wireless signals, an electronic device can use a wireless interface device that includes a wireless transceiver and/or a radio-frequency (RF) front-end. Electronic devices communicate with wireless signals using electromagnetic (EM) signaling at various frequencies that exist on a portion of the EM spectrum. These wireless signals may travel between two electronic devices while oscillating at a particular frequency, such as a kilohertz (kHz) frequency, a megahertz (MHz) frequency, or a gigahertz (GHz) frequency. The EM spectrum is, however, a finite resource that limits how many signals can be simultaneously communicated in any given spatial area. There are already billions of electronic devices that use this limited resource. To enable a greater number of simultaneous communications using EM signaling, the finite EM spectrum is shared among electronic devices. The EM spectrum can be shared using, for instance, frequency-division multiplexing (FDM) techniques and/or time-division multiplexing (TDM) techniques.

Techniques for FDM or TDM can entail separating the EM spectrum into different frequency bands and constraining communications to occur within an assigned frequency band. EM signals in different frequency bands can be communicated at the same time in a same area without significantly interfering with each other. To transmit a signal within a target frequency band, a transmit chain of a wireless interface device can apply a mixer to the signal to upconvert a relatively lower frequency to reach the target frequency band. To recover information carried by a signal that is received in the target frequency band, a receive chain of the wireless interface device can apply a mixer to the received signal to down-convert from the target frequency band to a lower frequency to facilitate further processing.

To perform frequency conversion, a mixer operates in conjunction with a local oscillator (LO) that produces a local oscillator signal (LO signal). The mixer "combines" (e.g., multiplies) an input signal with the LO signal to produce an output signal. The input signal carries information, and the output signal continues to carry the information after the signal mixing to convert the frequency. The mixer can be configured such that the output signal has a higher frequency than the input signal for frequency up-conversion in a transmit chain as part of processing a signal to be transmitted. Alternatively, the mixer can be configured such that the output signal has a lower frequency than the input signal for frequency down-conversion in a receive chain as part of processing a received signal. The frequency of the output signal is dependent, at least partly, on a frequency of the LO signal provided by the local oscillator.

To provide a purer signal for downstream processing after frequency conversion at a mixer, little if any of the LO signal should "leak" through the mixer independently of the information-carrying output signal. Local oscillator feedthrough (LOFT) refers to a LO signal that "leaks" through a mixer into a communication chain (e.g., a transmit chain or a receive chain) and adversely impacts downstream signal processing. LOFT can limit throughput of the system. For example, LOFT can increase an error vector magnitude (EVM) parameter, especially with wideband signaling. The EVM parameter measures how accurately a signal being transmitted or received matches an intended signal in terms of timing, phase, and/or strength as represented by a constellation diagram.

For transmission operations in particular, LOFT can decrease effective radiated power (ERP), which can be especially detrimental in systems that utilize beamforming. Further, for a mmW massive phase-array system, LOFT is particularly impactful because the "leaked" power on the field can potentially add together across elements of an antenna array. This summed "leaked" power can exceed an emission specification of a 3GPP standard, which may be approximately −13 decibels-per-meter (dBm)/MHz, depending on the range. This emission constraint results in a relatively stringent LOFT specification for each antenna element, given that each element is to be scaled down by 10*log(N), where "N" is the number of massive phase-array elements which can be turned on simultaneously.

To further utilize the finite EM spectrum more efficiently, some wireless interface devices implement beamforming. Beamforming focuses a transmission or reception in a targeted direction to facilitate spatial sharing of EM signals and/or to increase usable signal range. To implement beamforming, a wireless interface device is coupled to an antenna array having multiple antenna elements. To interface with the multiple antenna elements, the wireless interface device includes multiple communication chains. Employing multiple communication chains also makes meeting LOFT specifications increasingly more difficult.

In one approach, an external or additional filter can be used to filter out LO signal leakage at, e.g., an output of a power amplifier of a transmit chain. This filtering approach, however, creates excessive loss for transmission signal generation and emanation and for reception signal acquisition and processing. This loss limits performance and appreciably increases module cost and design complexity. Notably, LOFT is often generated by a mismatch in the local oscillator or the transconductance stage of a mixer, and these mismatches are intensifying in terms of both amount and frequency of occurrence as process scaling reaches several tens of nanometers (nm). LOFT can also or instead be generated by other components coupled along a communication chain.

In another approach, calibration to combat LOFT can be performed using external radio-frequency (RF) equipment, which is expensive, during manufacturing and testing. Further, as frequencies increase to utilize more of the limited EM spectrum, signal processing and transmission is reaching millimeter wave (mmW) frequencies. These mmW frequencies can include frequencies above approximately three to eight (3-8) gigahertz (GHz), and LOFT can occur at such mmW frequencies. The RF equipment used to capture spectrum at these frequencies during testing introduces even greater production costs and test time penalties.

For alternative approaches, this document describes devices and techniques that counteract LOFT without relying on external equipment to capture RF emanations. The described devices and techniques can thus reduce the production costs for wireless interface devices, including those operating at mmW frequencies. To avoid use of external RF testing equipment, the techniques can be implemented with automated testing equipment (ATE) using, e.g., a DC probing test program. Alternatively, the techniques can be employed in a factory calibration using a digital testing engine (DTE); a DTE scheme can avoid ATE production cost but likely with increased factory calibration time.

Generally, a mixer circuit of a communication chain can perform frequency conversion using a LO signal from a local oscillator. In example implementations, the mixer circuit includes a mixer and tuning circuitry. The tuning circuitry applies a calibration signal to the mixer to counteract LOFT, which may propagate along the communication chain. To determine the calibration signal, the mixer can be operated without receiving an information-carrying input signal (e.g., with the input signal having a substantially zero amplitude) during a calibration procedure. The mixer does, however, receive from the local oscillator a LO signal having a non-zero amplitude at a particular LO frequency.

A power detector is coupled to a point along the communication chain to obtain an indication of a propagating signal that includes at least a portion of the LOFT. The power detector detects a power level of the propagating signal based on the indication and provides the detected power level to controller circuitry. The controller circuitry adjusts the tuning circuitry to modify the calibration signal based on the detected power level. Because the detected power level arises from a mixer that is receiving a positive-amplitude LO signal but a zero-amplitude information-carrying signal, the detected power level can substantially represent the LOFT. Thus, the controller circuitry adjusts the tuning circuitry to minimize, or at least to reduce, the detected power level to reduce, if not minimize, the LOFT. The controller circuitry can be realized with analog or digital circuitry. The controller circuitry can establish one or more settings, such as by storing at least one value in a register, based on the calibration procedure.

During subsequent operation at the particular LO frequency, the tuning circuitry applies the calibration signal to the mixer to reduce the LOFT based on the established settings, such as by using the value stored in the register. The tuning circuitry can include, for example, at least one current source, which may realize part of a current-based digital-to-analog converter (IDAC). In some cases, the tuning circuitry uses the current source to inject current into the mixer to reduce the LOFT. In other cases, the tuning circuitry uses the current source to adjust a voltage applied to a back-gate terminal of a transistor of the mixer to reduce the LOFT. In these manners, the LOFT can be at least reduced without relying on expensive external testing equipment and instead by using onboard calibration circuitry. These and other implementations are described herein.

Description Examples

FIG. 1 illustrates an example environment 100 with an electronic device 102 that has a wireless interface device 120, which includes at least one example mixer circuit 130 and calibration circuitry 138. This document describes example implementations of the mixer circuit 130 and corresponding calibration circuitry 138, which may be parts of a radio-frequency front-end (RFFE), a transceiver, a communication processor, and so forth of an apparatus. In the environment 100, the example electronic device 102 communicates with a base station 104 through a wireless link 106.

In FIG. 1, the electronic device 102 is depicted as a smartphone. The electronic device 102, however, may be implemented as any suitable computing or other electronic device. Examples of an apparatus that can be realized as an electronic device 102 include a cellular base station, broadband router, access point, cellular or mobile phone, gaming device, navigation device, media device, laptop computer, desktop computer, tablet computer, and server computer. Other examples of an apparatus that can be realized as an electronic device 102 include a network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth. An electronic device 102 may be referred to with different terminology, such as a user equipment (UE) or a customer premises equipment (CPE).

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, another electronic device as described above generally, and so forth. Hence, the wireless link 106 can extend between the electronic device 102 and the base station 104 in any of various manners.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a $3^{rd}$ Generation Partnership Project (3GPP) Long-Term Evolution (LTE) standard, such as a $4^{th}$ Generation (4G), a $5^{th}$ Generation (5G), or a $6^{th}$ Generation (6G) cellular standard; an IEEE 802.11 standard, such as 802.11g, ac, ax, ad, aj, or ay standard (e.g., Wi-Fi® 6 or WiGig®); an IEEE 802.16 standard (e.g., WiMAX®); a Bluetooth® standard; an ultra-wideband (UWB) standard (e.g., IEEE 802.15.4); and so forth. In some implementations, the wireless link 106 may provide power wirelessly, and the electronic device 102 or the base station 104 may comprise a power source or a power sink.

As shown for some implementations, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media (e.g., a disc), magnetic media (e.g., a disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, camera or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similarly to or differently from the wireless link 106. The wireless interface device 120 may facilitate communication over any suitable type of wireless network, such as a wireless local area network (LAN) (WLAN), wireless personal-area-network (PAN) (WPAN), peer-to-peer (P2P) network, mesh network, cellular network, wireless wide-area-network (WAN) (WWAN), and/or navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like. Also, as described above, an electronic device 102 may alternatively be implemented as a base station 104, an access point, or another apparatus as set forth herein.

As shown in FIG. 1, the wireless interface device 120 can include at least one communication processor 124, at least one transceiver 126, and at least one radio-frequency front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or a processor generally can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals communicated (e.g., transmitted or received) via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include or be associated with a memory (not separately depicted) to store data and processor-executable instructions (e.g., code), such as the same CRM 110 or another CRM.

As shown, the wireless interface device 120 can include at least one mixer circuit 130, which is described below. More specifically, the transceiver 126 can include at least one mixer circuit 130-1, or the RF front-end 128 can include at least one mixer circuit 130-2 (including both components can have at least one mixer circuit 130 in accordance with an optional, but permitted herein, "inclusive-or" interpretation of the word "or"). The transceiver 126 can also include circuitry and logic for filtering, switching, amplification, channelization, frequency translation, and so forth.

Frequency translation functionality may include an up-conversion or a down-conversion of frequency that is performed through a single conversion operation (e.g., with a direct-conversion architecture) or through multiple conversion operations (e.g., with a superheterodyne architecture). The transceiver 126 can perform such frequency conversion (e.g., frequency translation) by using the mixer circuit 130-1 and an associated local oscillator 136. Generally, the transceiver 126 can include filters, switches, amplifiers, mixers, and so forth for routing and conditioning signals that are transmitted or received via the antenna 122.

In addition to the mixer circuit 130-1, the transceiver 126 can include an analog-to-digital converter (ADC) or a digital-to-analog converter (DAC) (not shown in FIG. 1). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figure 2:
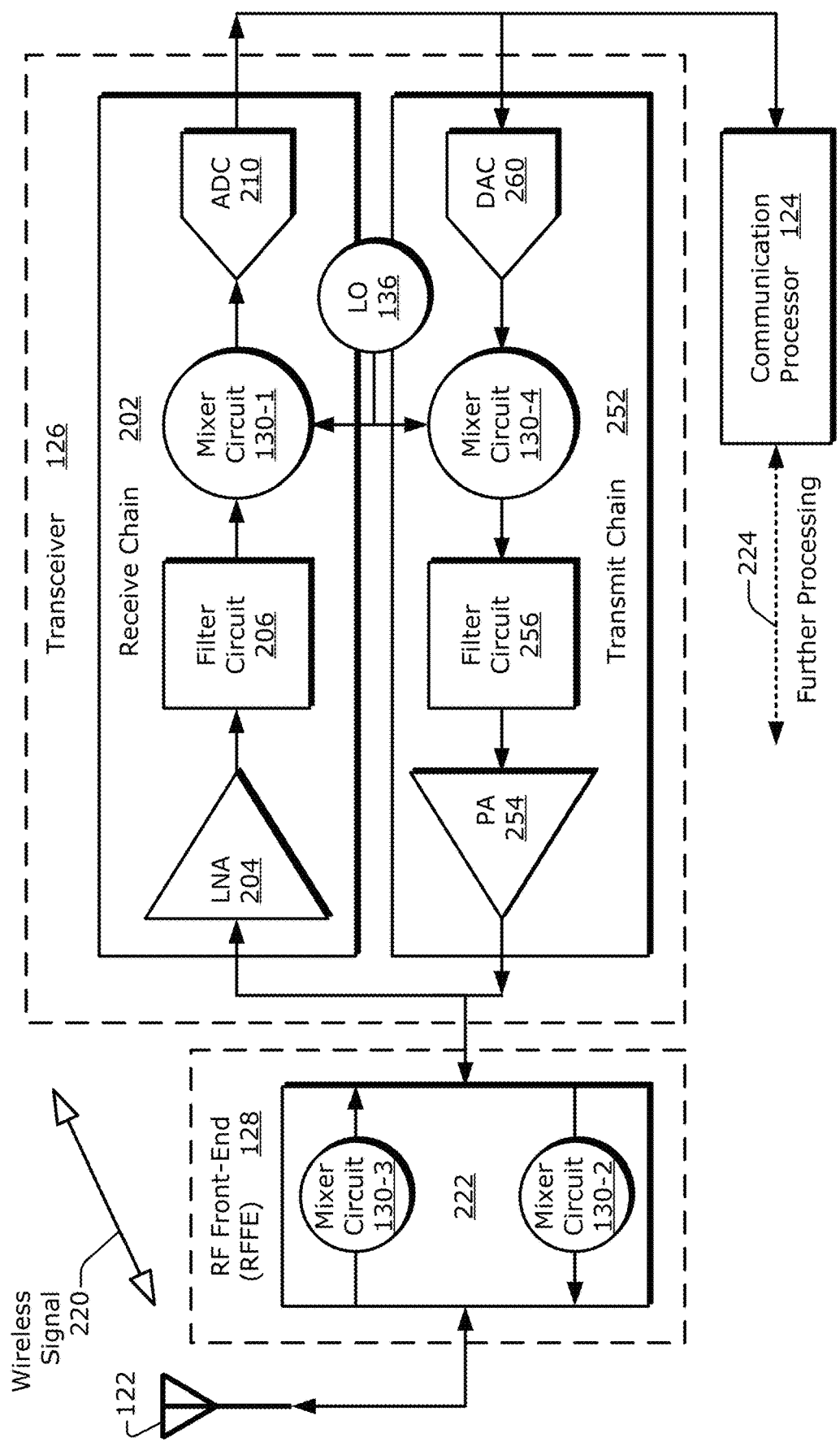
FIG. 2 is a schematic diagram illustrating an example radio-frequency (RF) front-end and an example transceiver that can each include at least one mixer circuit.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may include logic to perform in-phase/quadrature (I/Q) operations, such as synthesis, phase correction, modulation, demodulation, and the like.

The RF front-end 128 can also include one or more mixers-such as the mixer circuit 130-2—one or more filters, one or more switches, or one or more amplifiers for conditioning signals received via the antenna 122 or for conditioning signals to be transmitted via the antenna 122. The RF front-end 128 may also include a local oscillator, phase shifter (PS), peak detector, power meter, gain control block, antenna tuning circuit, N-plexer, balun, or the like. Configurable components of the RF front-end 128, such as some phase shifters, an automatic gain controller (AGC), or a reconfigurable version of the mixer circuit 130-3, may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In example implementations, the wireless interface device 120 includes at least one mixer circuit 130, at least one local oscillator 136 (LO 136), and at least one instance of calibration circuitry 138. The mixer circuit 130 is coupled to the local oscillator 136 and the calibration circuitry 138. These components may be separately or jointly positioned at the communication processor 124, the transceiver 126, the RF front-end 128, or a combination thereof, including by being distributed across two or more sections or parts of the wireless interface device 120. In FIG. 1, an example mixer circuit 130 is depicted as being part of a transceiver 126 as a mixer circuit 130-1, as being part of an RF front-end 128 as a mixer circuit 130-2, and so forth. Described implementations of a mixer circuit 130 can, however, additionally or alternatively be employed in other portions of the wireless interface device 120 or in other portions of the electronic device 102 generally.

As set forth above, a mixer circuit 130 can be included in an electronic device besides a cell phone, such as a base station 104 or wireless access point. Also, with a base station (or with a mobile phone or other electronic device that uses a superheterodyne architecture), a mixer for an, e.g., intermediate frequency (IF) section of a wireless interface device 120 may be realized using a mixer circuit 130 as described herein. Other electronic device apparatuses that can employ a mixer circuit 130 and corresponding calibration circuitry 138 include a laptop, communication hardware of a vehicle, a wireless access point, a wearable device, and so forth as described herein.

In example implementations, the mixer circuit 130 can include at least one mixer 132 and at least one instance of tuning circuitry 134. The mixer 132 is coupled to the tuning circuitry 134. Although certain components are shown as being part of an example mixer circuit 130 in FIG. 1, a given mixer circuit may have more, fewer, or different components. Examples of mixer circuits are described below with reference to FIGS. 5 through 8.

During operation, the local oscillator 136 feeds a LO signal to the mixer 132 of the mixer circuit 130. The LO signal can "leak" into other parts of the wireless interface device 120, such as along a communication chain (not shown in FIG. 1) of which the mixer 132 forms a part. To account for this LO feedthrough (LOFT), the calibration circuitry 138 controls the tuning circuitry 134 to provide one or more counteracting calibration signals, such as a current or a voltage, to the mixer 132. This can reduce the LOFT to improve EVM, ERP, and other wireless performance characteristics. Example approaches to calibration procedures are described below with reference to FIGS. 3 and 4. Next, however, this document describes example implementations of a transceiver and an RF front-end with reference to FIG. 2.

FIG. 2 is a schematic diagram of circuitry 200 illustrating an example RF front-end 128 and an example transceiver 126 that can each include at least one mixer circuit 130. FIG. 2 also depicts an antenna 122 and a communication processor 124. The communication processor 124 communicates one or more data signals to other components, such as the application processor 108 of FIG. 1, for further processing at 224 (e.g., for processing at an application level) for reception operations. For transmission operations, the communication processor 124 communicates one or more data signals from other components to the transceiver 126. As shown, the circuitry 200 can include a mixer circuit 130-1, a mixer circuit 130-2, a mixer circuit 130-3, or a mixer circuit 130-4, including one to four of such mixer circuits. The circuitry 200, however, may include a different quantity of mixers (e.g., more or fewer), may include mixers that are coupled together differently, may include mixers at different locations, may include mixers that are implemented as part of a frequency converter, and so forth.

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one signal propagation path 222. The at least one signal propagation path 222 can include at least one mixer circuit 130, such as the mixer circuit 130-2 and the mixer circuit 130-3. The example transceiver 126 includes at least one receive chain 202 (or receive path 202) and at least one transmit chain 252 (or transmit path 252). Although only one RF front-end 128, one transceiver 126, and one communication processor 124 are shown at the circuitry 200, an electronic device 102, or a wireless interface device 120 thereof, can include multiple instances of any or all such components. Also, although only certain components are explicitly depicted in FIG. 2 and are shown coupled together in a particular manner, the transceiver 126 or the RF front-end 128 may include other non-illustrated components (e.g., switches or diplexers), more or fewer components, differently coupled arrangements of components, and so forth.

In some implementations, the RF front-end 128 couples the antenna 122 to the transceiver 126 via the signal propagation path 222. In operation, the signal propagation path 222 carries a signal between the antenna 122 and the transceiver 126. During or as part of the signal propagation, the signal propagation path 222 conditions the propagating signal, such as with the mixer circuit 130-2 or the mixer circuit 130-3. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or a signal propagation path 222 thereof, may include one or more other components, such as another mixer, a filter, an amplifier (e.g., a power amplifier (PA) or a low-noise amplifier (LNA)), an N-plexer, a phase shifter, a diplexer, one or more switches, and so forth.

In some implementations, the transceiver 126 can include at least one receive chain 202, at least one transmit chain 252, or at least one receive chain 202 and at least one transmit chain 252. From left to right, the receive chain 202 can include a low noise amplifier 204 (LNA 204), a filter circuit 206, the mixer circuit 130-1 for frequency down-conversion, and an ADC 210. The transmit chain 252 can include a power amplifier 254 (PA 254), a filter circuit 256, the mixer circuit 130-4 for frequency up-conversion, and a DAC 260. However, the receive chain 202 or the transmit chain 252 can include other components—for example, additional amplifiers or mixers, multiple filters, at least one transformer, one or more buffers, or at least one phase-locked loop—that are electrically or electromagnetically coupled anywhere along the depicted receive and transmit chains.

The receive chain 202 is coupled between the signal propagation path 222 of the RF front-end 128 and the communication processor 124—e.g., via the low-noise amplifier 204 and the ADC 210, respectively. The transmit chain 252 is coupled between the signal propagation path 222 and the communication processor 124—e.g., via the power amplifier 254 and the DAC 260, respectively. The transceiver 126 can also include at least one local oscillator 136 (LO 136) that is coupled to the mixer circuit 130-1 or the mixer circuit 130-4, including to both mixer circuits. For example, the transceiver 126 can include one local oscillator 136 for each transmit/receive chain pair, one local oscillator 136 per transmit chain and one local oscillator 136 per receive chain, multiple local oscillators 136 per transmit or receive chain, and so forth. Each of the mixer circuit 130-2 and the mixer circuit 130-3 of the RF front-end 128 may also be coupled to the same local oscillator 136 or to a different local oscillator (not shown in FIG. 2).

As depicted along a signal propagation direction for certain example implementations of the receive chain 202, the antenna 122 is coupled to the low noise amplifier 204 via the signal propagation path 222 and the mixer circuit 130-3 thereof, and the low noise amplifier 204 is coupled to the filter circuit 206. The filter circuit 206 is coupled to the mixer circuit 130-1, and the mixer circuit 130-1 is coupled to the ADC 210. The ADC 210 is in turn coupled to the communication processor 124. As depicted along a signal propagation direction for certain example implementations of the transmit chain 252, the communication processor 124 is coupled to the DAC 260, and the DAC 260 is coupled to the mixer circuit 130-4. The mixer circuit 130-4 is coupled to the filter circuit 256, and the filter circuit 256 is coupled to the power amplifier 254. The power amplifier 254 is coupled to the antenna 122 via the signal propagation path 222 using the mixer circuit 130-2 thereof. Although only one receive chain 202 and one transmit chain 252 are explicitly shown, an electronic device 102, or a transceiver 126 thereof, can include multiple instances of either or both components. Although the ADC 210 and the DAC 260 are illustrated as being separately coupled to the communication processor 124, they may share a bus or other means for communicating with the processor 124.

As part of an example signal-receiving operation, the mixer circuit 130-3 (if present) of the signal propagation path 222 down-converts a received signal (e.g., to an intermediate frequency (IF)) and forwards the down-converted signal to the low-noise amplifier 204. The low-noise amplifier 204 accepts the down-converted signal from the RF front-end 128 and provides an amplified signal to the filter circuit 206 based on the accepted signal. The filter circuit 206 filters the amplified signal and provides a filtered signal to the mixer circuit 130-1. The mixer circuit 130-1 performs a frequency down-conversion operation on the filtered signal to down-convert from one frequency to a lower frequency (e.g., from the IF to a baseband frequency (BBF) if the mixer circuit 130-3 is present or from a radio frequency (RF) to an IF or BBF in the absence of the mixer circuit 130-3). The mixer circuit 130-1, or multiple mixer circuits, can perform the frequency down-conversion in a single conversion step or through multiple conversion steps using at least one local oscillator 136. The mixer circuit 130-1 can provide a down-converted analog signal to the ADC 210 for analog-to-digital conversion and subsequent forwarding to the communication processor 124 as a digital signal.

As part of an example signal-transmitting operation, the DAC 260 converts a digital signal received from the communication processor 124 to an analog signal. The mixer circuit 130-4 accepts the analog signal at a BBF or an IF from the DAC 260. The mixer circuit 130-4 upconverts the analog signal to a higher frequency, such as to an IF or an RF, to produce a higher-frequency signal using a signal generated by the local oscillator 136 to have a target synthesized frequency. The mixer circuit 130-4 provides the RF or other upconverted signal to the filter circuit 256. The filter circuit 256 filters the upconverted IF or RF signal and provides a filtered signal to the power amplifier 254. Thus, after the filtering by the filter circuit 256, the power amplifier 254 amplifies the filtered signal and provides an amplified signal to the signal propagation path 222 for signal conditioning. The RF front-end 128 can, for instance if the amplified signal is at IF, use the mixer circuit 130-2 of the signal propagation path 222 to provide an RF signal to the antenna 122 for emanation as a wireless signal 220.

Example implementations of a mixer circuit 130, as described herein, may be deployed at any one or more of the example mixer circuits 130-1, 130-2, 130-3, or 130-4 in the transceiver 126 or the RF front-end 128 or at other mixer circuits of an electronic device 102 (not shown in FIG. 2). The circuitry 200, however, depicts just a few examples for a transceiver 126 and an RF front-end 128. In some cases, the various components that are illustrated in the drawings using separate schematic blocks or circuit elements may be manufactured or packaged in different discrete manners. For example, one physical module may include components of the RF front-end 128 and some components of the transceiver 126, and another physical module may combine the communication processor 124 with the remaining components of the transceiver 126.

Further, in some cases, the antenna 122 may be co-packaged into a module with at least some components of the RF front-end 128 or the transceiver 126. For instance, in a non-limiting example corresponding to a mmW implementation, the transceiver 126 may provide an IF signal to the RF front-end 128. In some of such cases, the RF front-end 128 may be co-packaged into a module with an antenna array version of the antenna 122. Here, the RF front-end 128 includes one or more mixer circuits 130-2 and 130-3 that are configured to upconvert and down-convert between the IF/RF signals. The RF front-end 128 can also provide further signal conditioning, such as phase shifting and the like for beamforming. In another non-limiting example, such as for a 5G New Radio (NR) Frequency Range 1 (FR1) implementation, the RF front-end 128 may not include a mixer (e.g., with a direct-conversion architecture in which frequency translation between BB and RF occurs in the transceiver 126). Even without a mixer, the RF front-end 128 may nonetheless include other components, such as a power amplifier, a low-noise amplifier, a filter, or other conditioning circuitry for processing after or before (for transmission or reception operations, respectively) the signal is processed by the transceiver 126.

In alternative implementations, one or more components may be physically or logically "shifted" to a different part of the wireless interface device 120 as compared to the illustrated circuitry 200 and/or may be incorporated into a different module. For example, a low-noise amplifier 204 or a power amplifier 254 may alternatively or additionally be deployed in the RF front-end 128. Similarly, an ADC 210 or a DAC 260 may alternatively be deployed in the communication processor 124. Further, a receive chain or a transmit chain may be present in the RF front-end 128, and/or the depicted receive chain 202 or transmit chain 252 may be extended into the RF front-end 128 such that the chain(s) are at least partially distributed across the transceiver 126 and the RF front-end 128. A general communication chain with a mixer circuit 130 is described next with reference to FIG. 3.

Figure 3:
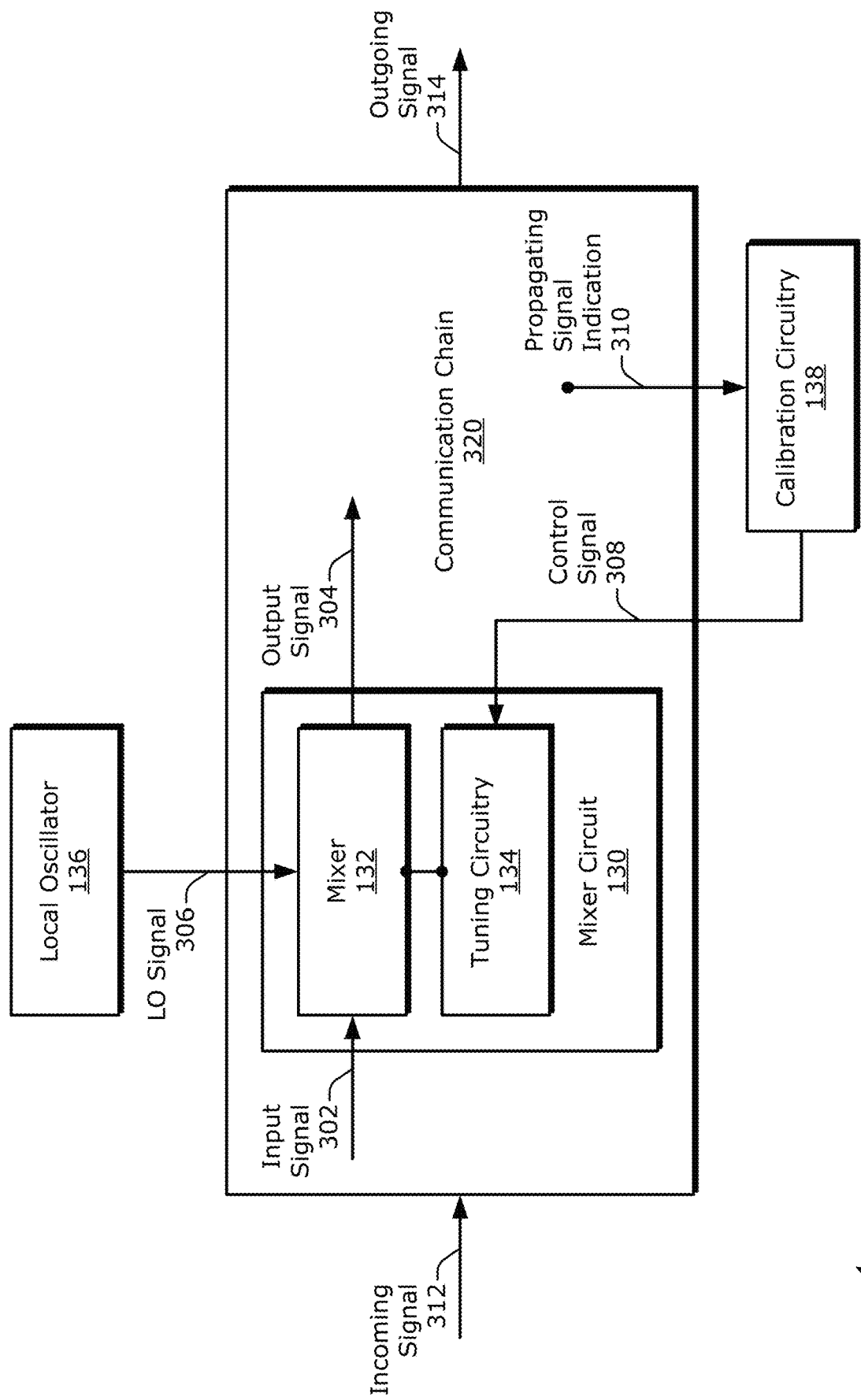
FIG. 3 is a schematic diagram illustrating an example communication chain including a mixer circuit with an associated local oscillator and corresponding calibration circuitry.

FIG. 3 is a schematic diagram 300 illustrating an example communication chain 320 including a mixer circuit 130 with an associated local oscillator 136 and corresponding calibration circuitry 138. As illustrated, the communication chain 320 may accept an incoming signal 312 and produce an outgoing signal 314. The communication chain 320 may be realized, for example, as a receive chain 202, a transmit chain 252, or a portion thereof (of FIG. 2). Example circuit implementations of the communication chain 320 are described below with reference to FIG. 4.

In example implementations, the mixer circuit 130 is electrically or electromagnetically coupled along the communication chain 320. The local oscillator 136 and the calibration circuitry 138 are coupled to the mixer circuit 130. The calibration circuitry 138 is coupled to a point or node along the communication chain 320 in any of multiple manners as described below with reference to FIG. 4. Although the two components are depicted separately from the communication chain 320 in FIG. 3, the local oscillator 136 or the calibration circuitry 138 (including both in some cases) can be included fully or partially as a component of the communication chain 320. Alternatively, but by way of example only, the local oscillator 136 may service mixer circuits of multiple communication chains, and the calibration circuitry 138 may be incorporated at least partially as a portion of a communication processor (e.g., the communication processor 124 of FIGS. 1 and 2).

As shown, the mixer circuit 130 includes the mixer 132 and the tuning circuitry 134. The mixer 132 is coupled to the tuning circuitry 134. In some cases, the calibration circuitry 138 is coupled to the tuning circuitry 134. In at least some of such cases, the calibration circuitry 138 can be coupled between the mixer circuit 130 via the tuning circuitry 134 and anode or component of the communication chain 320. The local oscillator 136 can be coupled to the mixer circuit 130 via the mixer 132.

In example operations, the local oscillator 136 generates a LO signal 306. The mixer 132 accepts or receives an input signal 302 from an upstream component (not shown in FIG. 3) of the communication chain 320. The mixer 132 also accepts or receives the LO signal 306 from the local oscillator 136. Based on the input signal 302 and the LO signal 306, the mixer 132 produces an output signal 304. The mixer 132 provides or forwards the output signal 304 to a downstream component (not shown in FIG. 3) of the communication chain 320. The mixer 132 converts a frequency of the input signal 302 (e.g., an input frequency) to another frequency of the output signal 304 (e.g., an output frequency) based on a LO frequency of the LO signal 306. The frequency conversion (or "frequency translation") may be an up-conversion that increases the frequency (e.g., for a transmit chain) or a down-conversion that decreases the frequency (e.g., for a receive chain).

The calibration circuitry 138 obtains an indication of a signal that is propagating along the communication chain 320, which is referred to herein as a propagating signal indication 310. Based on the propagating signal indication 310, the calibration circuitry 138 produces a control signal 308. The calibration circuitry 138 provides the control signal 308 to the mixer circuit 130 via the tuning circuitry 134. Responsive to the control signal 308, the tuning circuitry 134 modifies the behavior or operation of the mixer 132 to counteract (e.g., at least reduce, if not minimize) feedthrough of the LO signal 306 into the communication chain 320.

A timing of a calibration procedure can vary based on implementation. In some cases, the calibration circuitry 138 is run initially to establish a tuning value. The calibration circuitry 138 may be run, for instance, as part of a factory calibration during manufacture of a wireless interface device or assembly of an electronic device. The resulting tuning value can be stored by the wireless interface device for later use. Subsequently, the stored tuning value is retrieved or applied so the turning circuitry 134 can calibrate the mixer circuit 130 and thereby reduce the LOFT. The subsequent use may occur, for instance, during mission mode operation (e.g., in the field). In other cases, the calibration procedure may be performed while the electronic device is in the field. In still other cases, calibration procedures may be performed by a device manufacturer and again later by a device user.

Later calibration procedures may be performed once or repeatedly (e.g., at start up, at regular intervals, based on environmental changes, or responsive to band or other frequency changes). In any of such cases, example implementations of the calibration procedure can be performed in manners that at least substantially isolate downstream effects of the LO signal 306 from those of the input signal 302 as described next with reference to FIG. 4.

Figure 4:
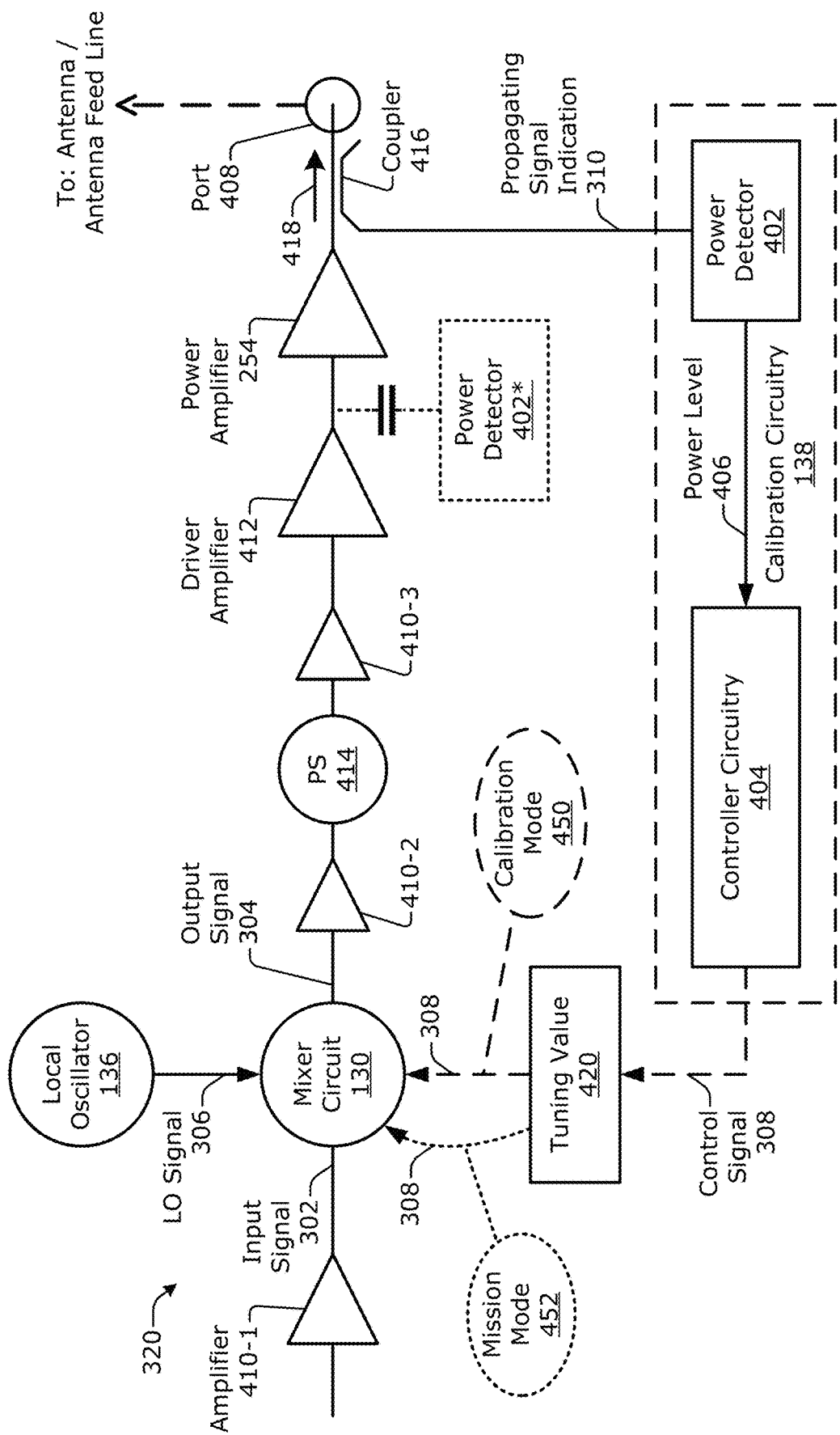
FIG. 4 is a circuit diagram illustrating an example communication chain including a mixer circuit with an associated local oscillator and corresponding calibration circuitry.

FIG. 4 is a circuit diagram 400 illustrating an example communication chain 320 including a mixer circuit 130 with an associated local oscillator 136 and corresponding calibration circuitry 138. As shown, the communication chain 320 includes multiple components chained together in series between an amplifier 410-1 and a port 408. Although only a single line is used to depict that these components are coupled together, the components may be single-ended with single (or "unbalanced") coupling lines, or the components may be differential, and the coupling lines may likewise be differential (or "balanced"). In some cases, the port 408 may represent a terminal point or node of the communication chain 320. The port 408 can be coupled to an antenna 122 (not shown in FIG. 4) and/or to an antenna feed line. The antenna feed line, or an extension of the communication chain 320 or an additional communication chain, may include other components. As described below, the circuit diagram 400 may operate in multiple modes (e.g., a first mode and a second mode) at different times, such as in a calibration mode 450 at a first time and in a mission mode 452 at a second time.

The illustrated components include multiple amplifiers, such as amplifiers 410-1, 410-2, and 410-3; a driver amplifier 412; and a power amplifier 254. The example components along the communication chain 320 also include the mixer circuit 130 and at least one phase shifter 414 (PS 414). The communication chain 320 may, however, include more, fewer, and/or different components than those illustrated. Such other components may include one or more buffers, at least one filter, one or more switches, at least one transformer, other components described herein, and so forth. The components may also be rearranged or reordered along the serial chain of components before or after the mixer circuit 130. Further, although the communication chain 320 of FIG. 4 corresponds to a transmit chain, the principles described herein are applicable to a receive chain implementation of the communication chain 320.

In example implementations, the calibration circuitry 138 includes at least one power detector 402 and at least one instance of controller circuitry 404. The power detector 402 and the controller circuitry 404 are coupled together in series between a node or point along the communication chain 320 and the mixer circuit 130. From a signal or information propagation perspective or a temporal perspective, the power detector 402 may operate before the controller circuitry 404.

In example operations, the power detector 402 obtains the propagating signal indication 310 from the communication chain 320. The power detector 402 may use another component to obtain the propagating signal indication 310. For example, the power detector 402 may use a coupler 416. The coupler 416 can be realized in different manners, such as with a directional coupler. In the depicted example, the coupler 416 can sense a propagating signal 418 and provide the propagating signal indication 310, which represents the propagating signal 418.

In alternative implementations, the coupler 416 can be placed at a different position, such as at any node along the communication chain 320. For instance, the coupler 416 can be coupled to a node between the phase shifter 414 and the amplifier 410-3 or between the mixer circuit 130 and the amplifier 410-2. Additionally or alternatively, a power detector may obtain a propagating signal indication 310 using a different type of component. For example, an alternative power detector 402* can obtain an indication of the signal propagating along the communication chain 320 between the driver amplifier 412 and the power amplifier 254 using at least one capacitor, as shown. Generally, a power detector 402 can obtain an indication of the propagating signal using one or more different components that are coupled electrically or electromagnetically to any point along the communication chain 320.

Continuing with a description of operational examples, the power detector 402 receives the propagating signal indication 310 from the coupler 416. The power detector 402 detects a power level 406 of the propagating signal 418 based on the propagating signal indication 310. The power detector 402 can be realized using, for instance, at least one diode. The power detector 402 provides the power level 406 to the controller circuitry 404. The controller circuitry 404 receives the power level 406 from the power detector 402.

The controller circuitry 404 may be realized using, at least partially, one or more digital circuits. These digital circuits may be part of the communication processor 124 or another portion of the wireless interface device 120. Such digital circuits may also be distributed across multiple portions of the wireless interface device 120. The digital circuits may include, for example, an analog-to-digital converter (ADC) and logic circuitry. The ADC can produce a digital version of the power level 406. The logic circuitry can determine at least one value (e.g., a digital version of a tuning value 420) for a register based on the digital power level during the calibration mode 450. The logic circuitry may, for instance, iteratively use different values to reduce, if not minimize, the digital power level to a degree permissible given the quantization of the power level 406, a noise floor, and so forth.

Additionally or alternatively, the controller circuitry 404 may be realized using, at least partially, one or more analog circuits. For instance, as part of an analog control loop, the controller circuitry 404 can include a comparator that compares the power level 406 to a threshold power level, such as one at or near a noise floor. Based on the power level 406, the controller circuitry 404 produces the control signal 308 using analog or digital circuitry during the calibration mode 450. The controller circuitry 404 provides the control signal 308 (e.g., as an analog version of a tuning value 420) to the mixer circuit 130. Use of the control signal 308 by the mixer circuit 130 is described below with reference to FIGS. 5-8.

Generally, the control signal 308 is produced to counteract flowthrough of the LO signal 306 through some portion of the communication chain 320. To separate signaling effects of the input signal 302 from those of the LO signal 306, the controller circuitry 404 can cause the input signal 302 to be substantially zero (0) from at least an alternating current (AC) perspective during the calibration mode 450. For example, the mixer 132 (not shown in FIG. 4) of the mixer circuit 130 or the amplifier 410-1 can be fed a low or no-amplitude input signal, the amplifier 410-1 can be turned off, or a mixer input of the mixer circuit 130 can be disconnected from the amplifier 410-1.

Thus, the output signal 304 provided by the mixer circuit 130 substantially results from leakage of the LO signal 306. This feedthrough of the LO signal 306 can be propagated through one or more other components along the communication chain 320. Accordingly, the propagating signal 418 may be sensed or otherwise obtained anywhere along the communication chain 320 downstream of, or "after," the mixer circuit 130. However, the closer the coupler 416 or other sensing component is positioned to the port 408, the more the deleterious effects of other mismatched components besides the mixer may be compensated for with the calibration procedure.

In some implementations, a calibration procedure can be performed using one or more of the following techniques during the calibration mode 450. To isolate the LO signal 306 at least partially, the input signal 302 (e.g., a baseband or intermediate frequency input signal) is set to a substantially zero magnitude (e.g., no signal power is driven on the mixer input). The wireless interface device can be operated normally as if the device were in the field transmitting (or receiving for a receive chain implementation) with a target frequency band for calibration of the LOFT. The signal gain and filter frequency response along the communication chain 320 can be set to produce a maximum gain at the LO frequency of the LO signal 306. The LO feedthrough along the communication chain 320 is sensed with the power detector 402. A direct-current (DC) output of the power detector 402 is fed to an ADC of the controller circuitry 404. A calibration engine of the controller circuitry 404 can adjust the tuning value 420, which is applied to the tuning circuitry 134 of the mixer circuit 130 using a current mode or a voltage mode, which modes are described below with reference to FIGS. 6 and 7, respectively.

A tuning value 420 for the control signal 308 can be realized as a calibration code that is determined by converging to a code offering a minimum detected power level 406 and thus a minimum LOFT. Here, the minimum power level or LOFT is a minimum under one or more constraints, such as the implemented circuitry of the communication chain 320, a present oscillation frequency of the LO signal 306, the capabilities of the tuning circuitry 134, and an available precision of the bits in the digital circuitry portion of the calibration circuitry 138 and/or the calibration code of the control signal 308. The control signal 308, such as one or more bits of at least one tuning value 420 thereof, can be stored in at least one register that persists without power in association with a frequency of the local oscillator signal 306 at which the value is determined. The register can be realized using a flash memory, a programmable read-only memory (PROM), an electrically erasable programmable read-only memory (EEPROM), one or more fuses, and so forth.

Thus, in certain digital implementations for the controller circuitry 404, the controller circuitry 404 determines a tuning value 420 that is written to or otherwise stored in at least one register (not shown in FIG. 4) during the calibration mode 450. The register may be part of the controller circuitry 404, part of the mixer circuit 130 (e.g., part of the tuning circuitry 134 thereof), part of other control circuitry, some combination thereof, and so forth. During the mission mode 452, software, firmware, or other circuitry can read or otherwise retrieve the tuning value 420 from the register to apply the tuning value 420 to operation of the tuning circuitry 134. Or the register can otherwise be coupled to the tuning circuitry 134 to expose the tuning value 420 thereof to control the operation of the tuning circuitry 134. A wireless interface device 120 may also have multiple registers. For example, one register may retain the tuning value 420 without power (e.g., a nonvolatile memory cell), and another register may hold the tuning value 420 during the mission mode 452 after software, firmware, or circuitry loads the tuning value 420 from the one register to the other register. In other implementations, the calibration mode 450 and the mission mode 452 may be merged, or the device may switch between the two modes sufficiently quickly and/or frequently, that the calibration procedure is performed in a continued loop or in a partially-continuous or fully-continuous loop.

As indicated above, the calibration procedure may be performed during the calibration mode 450 at a target frequency of operation for transmission or reception. The calibration procedure may be repeated for multiple target frequencies to cover one or more frequency bands, such as low band (LB), mid band (MB), and high band (HB). A customized, potentially different tuning value 420 may be stored in association with each target frequency or frequency band during the calibration mode 450 in multiple registers. During the mission mode 452, the wireless interface device 120 loads a tuning value 420 that is associated with the target frequency or frequency band to be used from the multiple registers to a register that can control operation of the tuning circuitry 134. Accordingly, an amount of current steering by the tuning circuitry 134 to reduce LO leakage may be based on a band in which the device is operating.

In some implementations, the device may enter the calibration mode 450 and/or perform the calibration procedure once (or a few times) during manufacturing and then the determined tuning values may be used throughout the life of the device during instances of the mission mode 452. Additionally or alternatively, the device may enter the calibration mode 450 and/or perform the calibration procedure multiple times after the device reaches a user. For example, the calibration procedure can be performed during power-on or resets, at regular intervals (e.g., twice a day or once an hour), during periods when the wireless interface device 120 is not otherwise being used, responsive to changing target frequencies or frequency bands, based on changes to location of the device, combinations thereof, and so forth. The stored tuning values may be updated each time the device enters the calibration mode 450 and runs a calibration procedure. The device can then use updated tuning values in the mission mode 452.

Figure 5:
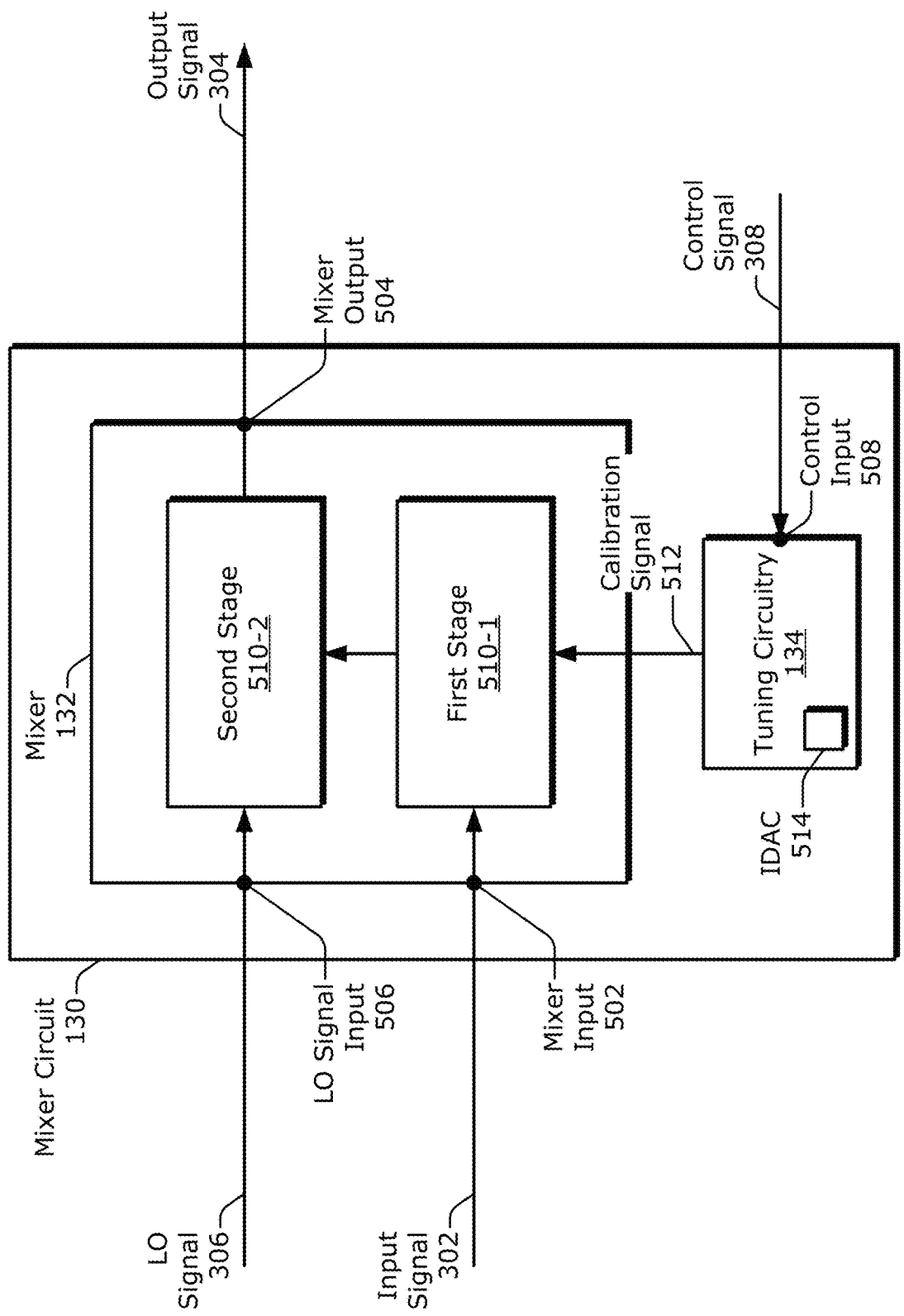
FIG. 5 is a schematic diagram illustrating an example mixer circuit including an example mixer with multiple stages and tuning circuitry.

FIG. 5 is a schematic diagram 500 illustrating an example mixer circuit 130 including example tuning circuitry 134 and an example mixer 132 with multiple stages 510-1 and 510-2. As shown, the mixer 132 includes a mixer input 502 to accept or receive the input signal 302, and a mixer output 504 to provide or transmit the output signal 304. The mixer 132 also includes a LO signal input 506 to accept or receive the LO signal 306. The tuning circuitry 134 includes a control input 508 to accept or receive the control signal 308. The input(s) and the output(s) can be realized, for example, with, a node, a port, at least a portion of a wire or other conductive element, at least part (e.g., a terminal) of a transistor, a combination thereof, and so forth.

Figure 6:
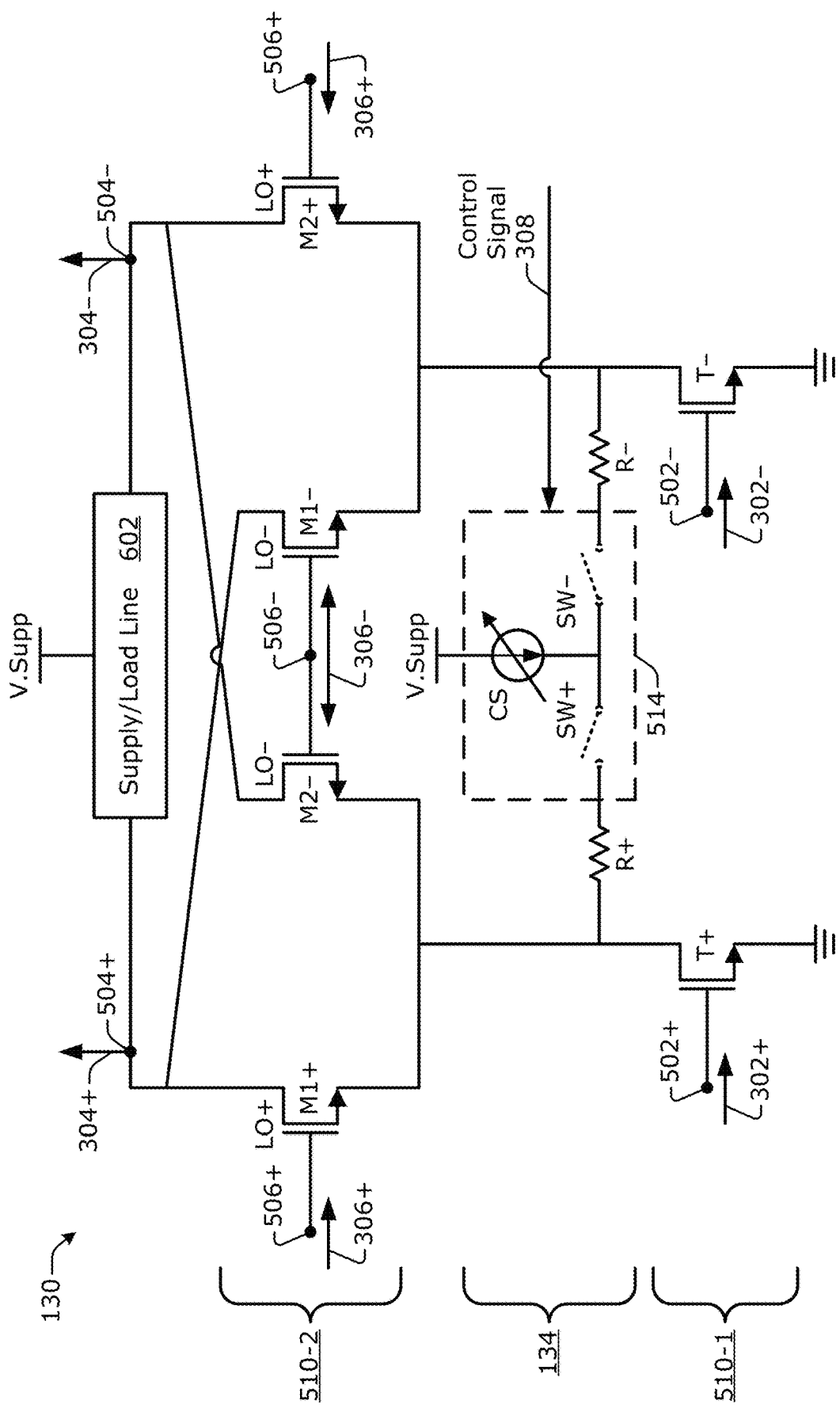
FIG. 6 is a circuit diagram illustrating an example mixer circuit including an example mixer with multiple stages and example tuning circuitry.
Figure 7:
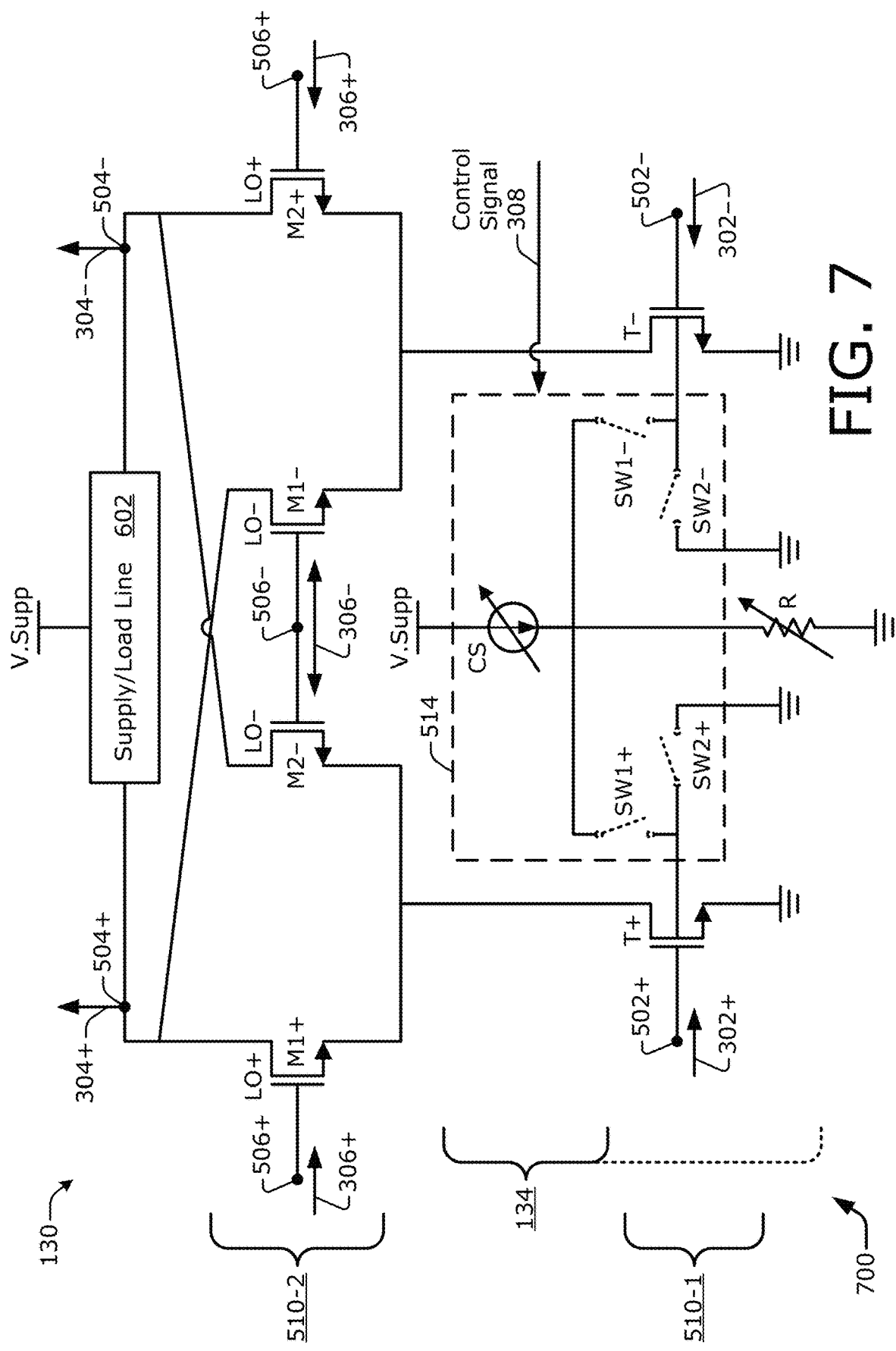
FIG. 7 is a circuit diagram illustrating another example mixer circuit including an example mixer with multiple stages and example tuning circuitry.

In example implementations, the mixer 132 includes multiple stages, such as two stages: a first stage 510-1 and a second stage 510-2. Other implementations of the mixer 132, however, may have a single stage or more than two stages. In some cases, the first stage 510-1 is realized as a transconductance stage (or "Gm stage") with at least one transistor (as shown in FIGS. 6 and 7), and the second stage 510-2 is realized as a cascode stage with one or more transistors (as shown in FIGS. 6 and 7). Examples of multistage implementations of the mixer 132 with multiple transistors are described below with reference to FIGS. 6 and 7.

In example operations, the tuning circuitry 134 produces a calibration signal 512 based on the control signal 308. The tuning circuitry 134 provides the calibration signal 512 to the mixer 132, such as to the first stage 510-1 thereof. The calibration signal 512 affects the operation of the mixer 132 to reduce feedthrough of the LO signal 306 to the output signal 304 and to downstream components. The calibration signal 512 can compensate for an imbalance in the plus-minus components of the mixer 132 or for imbalances in other components along the communication chain. In some implementations, such as those in which the controller circuitry 404 (of FIG. 4) is realized at least partially with digital circuitry, the tuning circuitry 134 includes at least one current source that is configured as a current-based DAC 514 (IDAC 514). Examples of IDAC-based implementations of tuning circuitry 134 are described next with reference to FIGS. 6 and 7.

FIGS. 6 and 7 are circuit diagrams 600 and 700 illustrating example mixer circuits 130 that each include a respective instance of the tuning circuitry 134. The tuning circuitry 134 of FIG. 6 operates in an example current mode, and the tuning circuitry 134 of FIG. 7 operates in an example voltage mode. Example implementations of the first and second stages 510-1 and 510-2 of the mixer 132 (which is explicitly depicted in, e.g., FIGS. 3 and 5) are described next with joint reference to FIG. 6 and FIG. 7. The first stage 510-1 includes at least one transistor T, such as a plus transistor T+ and a minus transistor T−. The second stage 510-2 includes one or more transistors M, such as a plus transistor M1+, a minus transistor M1−, another plus transistor M2+, and another minus transistor M2−.

The transistors of the mixer 132 can be arranged in accordance with, for example, a double-balanced Gilbert cell architecture. The illustrated Gilbert cell architecture includes a supply or load line 602 that is coupled to a voltage supply V.Supp and the one or more transistors M of the second stage 510-2. The at least one transistor T of the first stage 510-1 is coupled between the second stages 510-2 and a ground. The ground and the supply voltage V.Supp are two examples of a power distribution node.

Each transistor T or M may be realized with any one or more of multiple transistor types. Examples transistor types include a field effect transistor (FET), a junction FET (JFET), a metal-oxide-semiconductor FET (MOSFET), a bipolar junction transistor (BJT), an insulated-gate bipolar transistor (IGBT), and so forth. Manufacturers may fabricate FETs as n-channel or p-channel transistor types and may fabricate BJTs as NPN or PNP transistor types.

Each transistor may include at least one control terminal and one or more channel terminals. With an FET transistor, a control terminal can correspond to a gate terminal, and a channel terminal can correspond to a source terminal or a drain terminal. With a BJT transistor, a control terminal can correspond to a base terminal, and a channel terminal can correspond to an emitter terminal or a collector terminal.

In example implementations, the transistors of the mixer 132 (e.g., of FIG. 5) can be coupled together as shown in FIGS. 6 and 7. For example, the at least one transistor T of the first stage 510-1 is coupled between the mixer input 502 (e.g., a plus mixer input 502+ or a minus mixer input 502−) and the mixer output 504 (e.g., a plus mixer output 504+ or a minus mixer output 504−). The one or more transistors M of the second stage 510-2 are coupled between the at least one transistor T of the first stage 510-1 and the mixer output 504. The one or more transistors M are also coupled between a local oscillator signal input 506 (e.g., a plus LO signal input 506+ or a minus LO signal input 506−) and the mixer output 504. The tuning circuitry 134 includes at least one current source CS coupled to the at least one transistor T of the first stage 510-1.

As shown for a differential signaling implementation, each signal may be realized with a differential signal. Thus, the input signal 302 can be realized as a plus input signal 302+ and a minus input signal 302−. The output signal 304 can be realized as a plus output signal 304+ and a minus output signal 304−. Further, the LO signal 306 can be realized as a plus LO signal 306+ and a minus LO signal 306−. The input signal 302 is coupled to the mixer 132 via the respective gate terminal(s) of the at least one transistor T of the first stage 510-1. The local oscillator 136 (e.g., of FIGS. 3 and 4) is coupled to the mixer 132 via the respective gate terminal(s) of the one or more transistors M of the second stage 510-2.

FIG. 6 is a circuit diagram 600 illustrating an example mixer circuit 130 including an example mixer with multiple stages 510-1 and 510-2 and example tuning circuitry 134. As shown, the tuning circuitry 134 includes at least one tunable current source CS, one or more switches SW, and one or more resistors R. A plus switch SW+ is coupled in series with a plus resistor R+ between the at least one current source CS and a channel terminal (e.g., a drain terminal) of a plus transistor T+ of the first stage 510-1. A minus switch SW− is coupled in series with a minus resistor R− between the at least one current source CS and a channel terminal (e.g., a drain terminal) of a minus transistor T− of the first stage 510-1.

Here, the tuning circuitry 134 is operated in an example current mode. In example implementations, the at least one current source CS is employed, in conjunction with the one or more switches SW, as part of a current-based DAC 514. Based on the control signal 308, the current-based DAC 514 sets the states (e.g., an open or closed state) of the switches SW. The at least one current source CS may be implemented as an adjustable current source as indicated.

In example operations, with the states of the switches SW set, the tuning circuitry 134 steers current from the at least one current source CS to the plus side or the minus side (e.g., to a channel terminal of the plus transistor T+ or a channel terminal of the minus transistor T−) of the first stage 510-1 of the mixer. The current is steered based on the control signal 308 using the one or more switches SW (e.g., a plus switch SW+ or a minus switch SW−). The control signal 308 also determines a magnitude of the current applied by the at least one current source CS. For example, the control signal 308 can control how much current is injected to one side of the mixer. If the LOFT is caused at least partially by the existence of relatively greater current on the plus side, for instance, then the current-based DAC 514 can steer current to the minus side to compensate. The tuning circuitry 134 can apply the current to at least one node corresponding to a channel terminal of at least one transistor T of the first stage 510-1 to adjust a magnitude of a current flowing through the one or more transistors M of the second stage 510-2.

The current-based DAC 514, with an example 8-bit control signal 308, can use one bit to steer the current and seven bits to set a magnitude of the current. The compensating or offset current is injected through a resistor R (e.g., a plus resistor R+ or a minus resistor R−). The value of the resistor R can be set by trading LOFT range versus gain performance. The higher the value of the resistor, the lower the gain degradation due to the current-based DAC 514, but the LOFT range is likewise lower. For implementations in which an IR drop is relatively more sensitive, the resistor R can be replaced with a differential-coupled transformer. The transformer can provide a higher impedance in the IF frequency domain but a lower DC-current-flow impedance to maintain the targeted LOFT range. This transformer alternative with a lower IR drop likely entails an area penalty. To increase matching between the current-based DAC 514 and the mixer Gm cell, the two can share a same reference current. The tuned offset current can generate an out-of-phase LO leakage and cancel intrinsic leakage from device mismatch, as well as other mismatches along the coupling path.

FIG. 7 is a circuit diagram 700 illustrating another example mixer circuit 130 including an example mixer with multiple stages 510-1 and 510-2 and example tuning circuitry 134. In FIG. 7, at least the transistor(s) of the first stage 510-1, which are indicated as a plus transistor T+ and a minus transistor T−, include a back-gate terminal. By way of example only, back-gate terminals can be designed into transistors built with Fully Depleted Silicon-On-Insulator (FDSOI) technology. The back-gate terminal can be used, for instance, to change a threshold voltage of the transistor.

As shown in FIG. 7, the tuning circuitry 134 includes at least one tunable current source CS, one or more switches SW, and at least one resistor R. Here, the tuning circuitry 134 is operated in a voltage mode. In example implementations, the at least one current source CS is employed, in conjunction with the one or more switches SW, as part of at least one current-based DAC 514. The at least one current source CS may be implemented as an adjustable current source as indicated by the arrow. Similarly, the at least one resistor R may be implemented as an adjustable resistor as indicated by the arrow. Based on the control signal 308, the current-based DAC 514 sets the states (e.g., open or closed states) of the switches SW1 and SW2 on the plus or minus side of the differential mixer circuit 130. For example, a second plus switch SW2+ or a second minus switch SW2− is placed in a closed state to ground the respective back-gate terminal of the plus or minus transistor T+ or T− if the respective back-gate terminal of the transistor T is not being adjusted by the current-based DAC 514.

Changing a level of a voltage of a back-gate terminal of a transistor T changes a threshold voltage of the transistor. For example, increasing a voltage level of the back-gate terminal decreases the threshold voltage. Accordingly, if the plus transistor T+ has a higher threshold voltage than the minus transistor T−, the first plus switch SW1+ is closed (and the first minus switch SW1− is opened), and a current from the current-based DAC 514 is turned on to provide a current flow across the resistor R. Further, the second plus switch SW2+ is opened, and the second minus switch SW2− is closed. This raises the level of the voltage of the back-gate terminal of the plus transistor T+, which can decrease the threshold voltage of the plus transistor T+ to improve the matching with the lower threshold voltage of the minus transistor T−. By using the current flow to change the back-gate terminal voltage and reduce the mismatch in threshold voltages between the plus and minus sides, the tuning circuitry 134 can reduce the LO leakage from the mixer circuit 130. The current flow can be steered to the plus or minus transistor side with suitable control of the switch states of the plus and minus switches SW1+, SW2+, SW1−, and SW2−. Compared to the approaches shown in FIG. 6, using the approaches of FIG. 7 to change a back-gate voltage can provide better resolution for a LO mismatch calibration, but the FIG. 7 approaches may also result in relatively less dynamic range for the LO mismatch calibration. The approaches of FIG. 6 or FIG. 7 can be used independently (e.g., separately) or combined depending on targeted performance levels and a given implementation. The switch states for the various approaches can be set based on the control signal 308 as described next with reference to FIG. 8.

Figure 8:
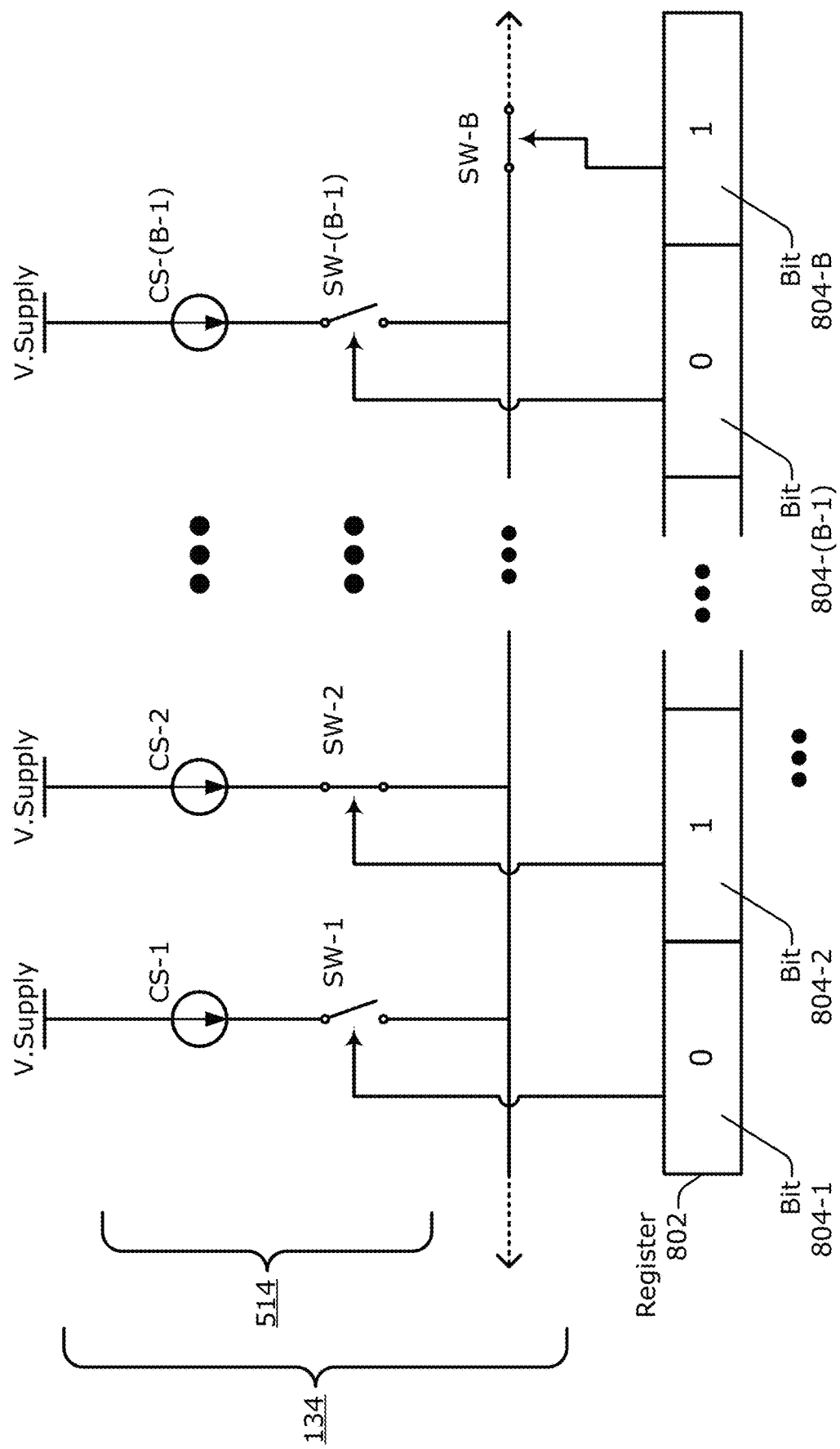
FIG. 8 is a circuit diagram illustrating an example interaction between tuning circuitry, which includes a current-based digital-to-analog converter (DAC) (IDAC), and a register that holds a value determined through a calibration procedure.

FIG. 8 is a circuit diagram 800 illustrating an example interaction between a current-based digital-to-analog converter 514 (IDAC 514) implementation of tuning circuitry 134 (e.g., of FIGS. 6 and 7) and a register 802 that holds a value (e.g., a tuning value 420 of FIG. 4) determined through a calibration procedure. Example calibration procedures are described with reference to FIGS. 4 and 10. The controller circuitry 404 of the calibration circuitry 138 (e.g., of FIG. 4) can determine a value that counteracts the LOFT by reducing, if not minimizing, the detected power level 406. The value can be stored in the register 802 through programming by the controller circuitry 404. The register 802 can be part of the controller circuitry 404, part of the tuning circuitry 134, part of each, or separate from both.

In example implementations, the current-based DAC 514 includes multiple current sources CS-1, CS-2, . . . , CS-(B−1) and multiple switches SW-1, SW-2, . . . , SW-(B−1), with "B" representing a positive integer. Each switch SW of the multiple switches SW-1 . . . SW-(B−1) is respectively coupled to a current source CS of the multiple current sources CS-1 . . . CS-(B−1). The current sources may provide identical, similar, or different currents—e.g., in terms of magnitude.

The register 802 is coupled to the multiple switches SW-1 . . . SW-(B−1). The register 802 includes multiple bits 804-1, 804-2, . . . , 804-(B−1). Each bit 804 of the multiple bits 804-1 . . . 804-(B−1) respectively corresponds to a switch SW of the multiple switches SW-1 . . . SW-(B−1). Each switch can be formed using at least one transistor. A bit 804 is configured to control a state (e.g., open state or closed state) of a corresponding switch SW, such as by being coupled to a control terminal thereof. In the depicted example, a zero-valued bit produces an open state for the corresponding switch, and a one-valued bit produces a closed state for the corresponding switch. These bit values and associated switch states may, however, be implemented differently. Further, although each bit is shown controlling a state of a single switch, a bit may alternatively control the state of multiple switches, like with implementations as shown in FIGS. 7 and 9.

To control which side of a differential mixer—e.g., the plus components or the minus components—are directly affected by the current or voltage mode adjustment, the register 802 can include a "Bth" bit 804-B. The tuning circuitry 134 includes another switch SW-B that is coupled to at least one transistor T of the first stage 510-1 (e.g., of FIGS. 6 and 7). The other bit 804-B of the register 802 corresponds to the other switch SW-B to control the plus or minus 'sign' of the tuning. Thus, the other bit 804-B of the register 802 is coupled to one or more other switches SW-B to provide its value, or the inverse thereof, to control the plus or minus 'sign' of the tuning. Although specific circuits are depicted in FIGS. 6-8 for the mixer circuit 130 and a register 802 and described herein, these are provided by way of example only. The illustrated and described components may be implemented with different components, in alternative arrangements, and so forth.

Figure 9:
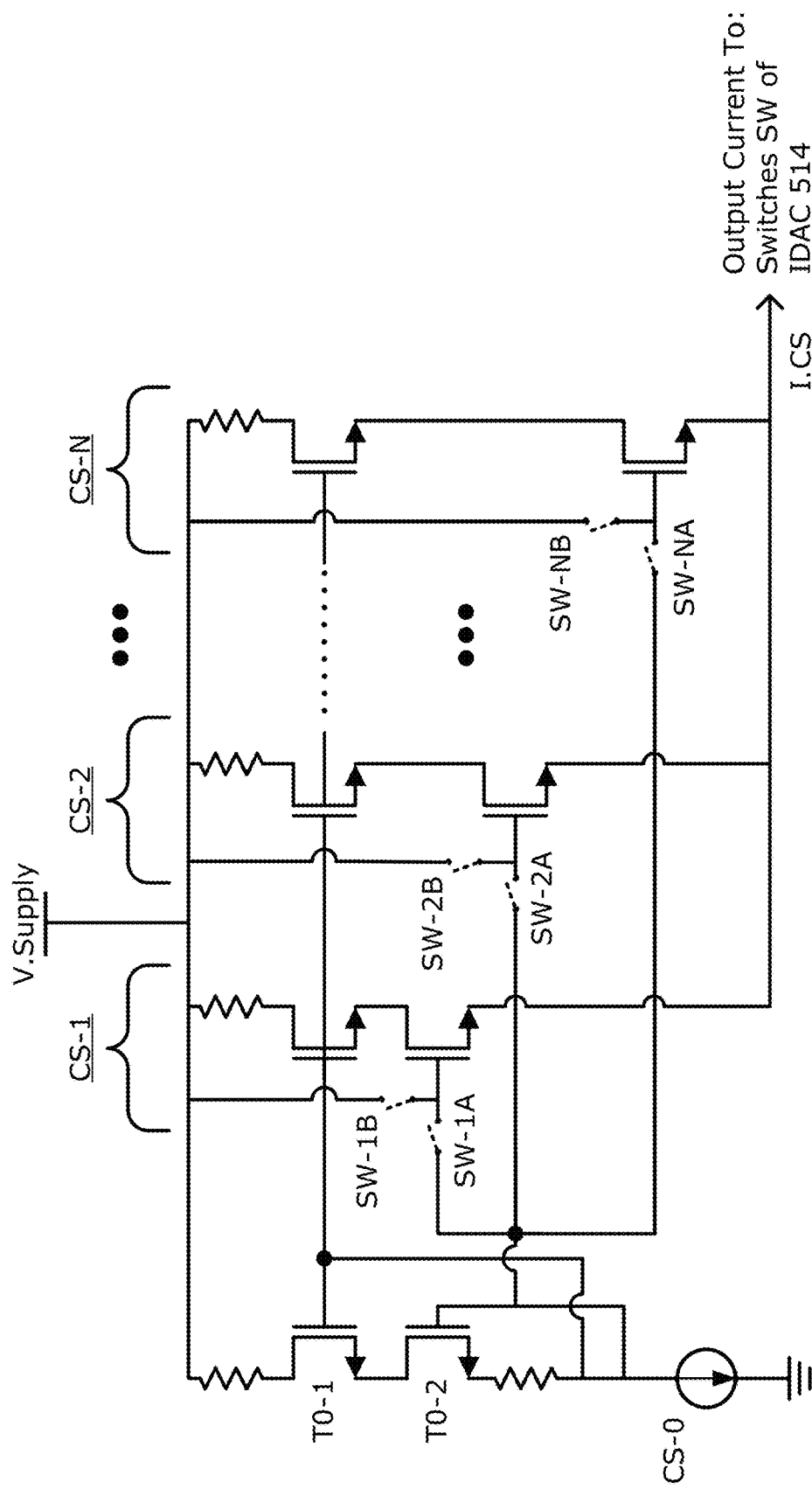
FIG. 9 is a circuit diagram illustrating an example current source that can produce an adjustable current using a current mirror architecture.

FIG. 9 is a circuit diagram 900 illustrating an example current source that can produce an adjustable current using a current mirror architecture. The circuit diagram 900 can be used to implement an adjustable current source CS of a current-based IDAC 514 of FIG. 6 or 7. The adjustable current source of FIG. 9 includes a current source CS-0 that produces a current that is mirrored over to multiple current sources CS-1, CS-2, . . . , CS-N, where "N" represents a positive integer, which can correspond to "(B−1)" of FIG. 8. The illustrated current mirror can provide a high tuning resolution to produce a current ICS. The current ICS is output to the switches SW of the IDAC 514 of FIGS. 6 and 7, which switches can be controlled by the "Bth" bit 804-B of FIG. 8, as is described above. A type of current ICS (e.g., a bias current from a bandgap reference that is independent of temperature (BGT) or a bias current that is proportional to temperature (PTT)) can be established to be the same as that for the mixer core. Accordingly, a calibration quality, or a degree of the cancelation of LO leakage from the applied current, can be maintained at a relatively robust level over temperature variation.

The two transistors TO-1 and TO-2 form a transistor stack pair that can mirror the current of the current source CS-0 to the transistor stack pairs of the multiple current sources CS-1 . . . CS-N. Each respective current source CS-x of the multiple current sources CS-1 . . . CS-N can be activated to contribute to the output current ICS based on the states of the respective switch pair SW-xA/SW-xB of the multiple switch pairs SW-1A/SW-1B, SW-2A/SW-2B, . . . , SW-NA/SW-NB. The states of these switch pairs SW-1A/SW-1B . . . SW-NA/SW-NB can be controlled by respective values (or the inverse thereof) of the multiple bits 804-1 . . . 804-(B−1) of FIG. 8, where "N" is equal to "(B−1)." An adjustable current source of a current-based IDAC 514 can, however, be implemented using different circuitry.

Figure 10:
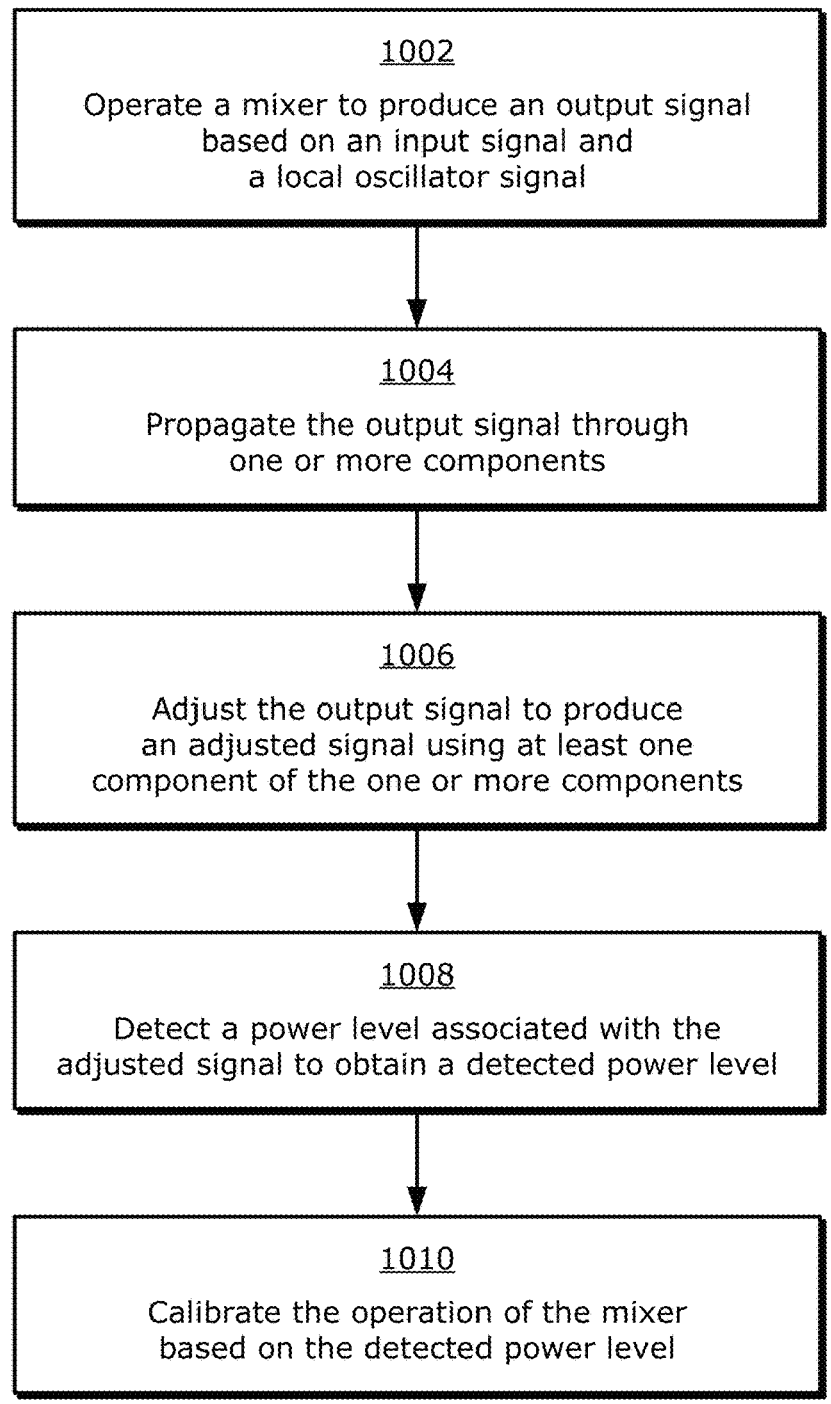
FIG. 10 is a flow diagram illustrating an example process for performing a calibration procedure to counteract oscillator signal feedthrough in relation to a mixer circuit.

FIG. 10 is a flow diagram illustrating an example process 1000 for performing a calibration procedure to counteract oscillator signal feedthrough in relation to a mixer circuit. The process 1000 includes five blocks 1002-1010 that specify operations that can be performed for a method. In example implementations, the operations of the blocks 1002-1010 may be performed during a calibration mode 450. At block 1002, a mixer is operated to produce an output signal based on an input signal and a local oscillator signal. For example, a mixer 132 can be operated to produce an output signal 304 based on an input signal 302 and a LO signal 306. To isolate at least partially the downstream effects resulting from feedthrough of the LO signal 306, the input signal 302 may be set to a substantially zero magnitude for the operation of the mixer 132, such as by disconnecting the mixer input 502 from signaling.

At block 1004, the output signal is propagated through one or more components. For example, the output signal 304 can be propagated through one or more components of a communication chain 320. In some cases, these components may include a filter (e.g., a filter 206 or a filter 256), a phase shifter 414, or one or more amplifiers, such as an amplifier 410, a driver amplifier 412, or a power amplifier 254.

At block 1006, the output signal is adjusted to produce an adjusted signal using at least one component of the one or more components. For example, the output signal 304 can be adjusted (e.g., filtered, phase shifted, or amplified) to produce an adjusted signal, such as the propagating signal 418, using at least one component, such as a filter (e.g., a filter circuit 206 or 256), a phase shifter (e.g., a phase shifter 414), or an amplifier (e.g., an amplifier 410, 412, or 254), of the one or more components along the communication chain 320. As shown in FIG. 4 by way of example, the propagating signal 418 may be amplified at least by the driver amplifier 412 or the power amplifier 254.

At block 1008, a power level associated with the adjusted signal is detected to obtain a detected power level. For example, a power level associated with the adjusted signal, such as the propagating signal 418, can be detected to obtain a detected power level 406. Here, a coupler 416 or other signal-sensing component may provide a propagating signal indication 310 that represents the propagating signal 418, and a power detector 402 may detect the power level thereof to obtain a detected power level 406.

At block 1010, the operating of the mixer is calibrated based on the detected power level. For example, the operating of the mixer 132 can be calibrated based on the detected power level 406. This calibrating may be performed by controller circuitry 404 that determines a control signal 308 that reduces the feedthrough of the LO signal 306 based on the detected power level 406. For instance, the controller circuitry 404 may iteratively adjust a tuning value 420 that is stored in at least one register to control a current-based digital-to-analog converter 514 (IDAC 514) to substantially minimize the detected power level 406, such as by reducing the power level toward a noise floor using a digital value that produces a lowest power level from among a set of available digital values.

The operation(s) of block 1010 may occur as part of the calibration mode 450. Subsequently, at least one stored tuning value 420, which is determined by the calibrating during the calibration mode 450, can be used in a mission mode 452. For example, the tuning value 420 can be used to tune the mixer circuit 130. In some cases, the determined tuning value 420 may be retrieved from one register and loaded into another register that is coupled to the tuning circuitry 134. The tuning circuitry 134 tunes an operation of the mixer 132 during the mission mode 452 using the tuning value 420 that is produced during the calibration mode 450.

Tuning circuitry 134 may adjust operation of the mixer 132 responsive to the control signal 308. In some cases, the tuning circuitry 134 may operate in a current mode by injecting at least one current into the mixer 132 to adjust the output signal 304 based on the detected power level 406. In other cases, the tuning circuitry 134 may operate in a voltage mode by changing a level of a voltage of a back-gate terminal of at least one transistor T to adjust the output signal 304 based on the detected power level 406.

FIG. 10 is a flow diagram illustrating example processes or methods related to oscillator feedthrough calibration. The processes are described in the form of a set of blocks that specify operations that can be performed. However, operations are not necessarily limited to the order shown in the figures or described herein, for the operations may be implemented in alternative orders or in fully or partially overlapping manners. Also, more, fewer, and/or different operations may be implemented to perform a respective process or an alternative process. Operations represented by the illustrated blocks of each process may be performed by an electronic device, such as the electronic device 102 of FIG. 1 or the wireless interface device 120 thereof. More specifically, the operations of the respective processes may be performed by a mixer circuit 130 of a transceiver 126 or an RF front-end 128, in conjunction with other components such as a power detector 402 or controller circuitry 404.

Although some of the description herein focusses on targeting LO leakage calibration for first-order harmonics of a LO frequency, the described principles (e.g., devices, circuitry, techniques, and processes) are not so limited. These principles are also applicable for second-order or other orders of LO harmonics calibration. For example, for some applications or a different frequency plan, instead of first-order harmonics of the LO signal, a higher order of harmonics of the LO signal may create a more severe problem (e.g., a 3GPP-emission concern or an EVM/throughput limitation). In such cases, the described principles can be extended to other harmonics. For instance, the frequency response of one or more amplifiers 410, 412, or 414 (in FIG. 4) can be changed such that the propagating signal is more proportional to the higher-order of LO harmonics that is more concerning.

Implementation Examples

This section describes some aspects of example implementations and/or example configurations related to the apparatuses and/or processes presented above.

Example aspect 1: An apparatus comprising:
a mixer circuit comprising:
    a first stage comprising at least one transistor coupled between a mixer input and a mixer output;
    a second stage comprising one or more transistors coupled between the at least one transistor of the first stage and the mixer output, the one or more transistors coupled between a local oscillator signal input and the mixer output; and
    tuning circuitry comprising at least one current source coupled to the at least one transistor of the first stage.

Example aspect 2: The apparatus of example aspect 1, wherein:
the tuning circuitry comprises a current-based digital-to-analog converter (IDAC).

Example aspect 3: The apparatus of example aspect 1 or 2, wherein the tuning circuitry comprises:
multiple current sources including the at least one current source of the tuning circuitry;
multiple switches, each switch of the multiple switches respectively coupled to a current source of the multiple current sources; and another switch coupled to the at least one transistor.

Example aspect 4: The apparatus of example aspect 3, further comprising:
at least one register coupled to the multiple switches, the at least one register comprising multiple bits, each bit of the multiple bits respectively corresponding to a switch of the multiple switches.

Example aspect 5: The apparatus of example aspect 4, wherein:
the at least one register comprises another bit corresponding to the other switch; and
the other switch of the tuning circuitry is coupled between the at least one current source of the tuning circuitry and the at least one transistor of the first stage.

Example aspect 6: The apparatus of any one of the preceding example aspects, wherein:
the at least one transistor of the first stage comprises a channel terminal; and
the at least one current source of the tuning circuitry is coupled to the channel terminal of the at least one transistor.

Example aspect 7: The apparatus of example aspect 6, wherein:
the one or more transistors of the second stage are coupled between the mixer output and the at least one transistor of the first stage via the channel terminal of the at least one transistor.

Example aspect 8: The apparatus of example aspect 6 or 7, wherein:
the tuning circuitry comprises at least one resistor coupled between the at least one current source and the channel terminal of the at least one transistor of the first stage.

Example aspect 9: The apparatus of example aspect 8, wherein:
the at least one transistor of the first stage comprises a plus transistor and a minus transistor;
the at least one resistor of the tuning circuitry comprises a plus resistor and a minus resistor; and
the tuning circuitry comprises:
    a plus switch coupled in series with the plus resistor between the at least one current source and the channel terminal of the plus transistor of the first stage; and
    a minus switch coupled in series with the minus resistor between the at least one current source and the channel terminal of the minus transistor of the first stage.

Example aspect 10: The apparatus of any one of example aspects 6-9, wherein:
the at least one current source of the tuning circuitry is configured to apply at least one current to at least one node corresponding to the channel terminal of the at least one transistor of the first stage to adjust a magnitude of a current flowing through the one or more transistors of the second stage.

Example aspect 11: The apparatus of any one of the preceding example aspects, wherein:
the at least one transistor of the first stage comprises a gate terminal and a back-gate terminal;
the gate terminal of the at least one transistor corresponds to the mixer input; and
the at least one current source of the tuning circuitry is coupled to the back-gate terminal of the at least one transistor.

Example aspect 12: The apparatus of example aspect 11, wherein:
the at least one current source of the tuning circuitry is configured to apply at least one current to at least one node corresponding to the back-gate terminal of the at least one transistor of the first stage to adjust a level of a voltage at the at least one node.

Example aspect 13: The apparatus of example aspect 12, wherein:
the tuning circuitry is configured, by adjusting the level of the voltage at the at least one node, to change a level of a voltage of the back-gate terminal of the at least one transistor of the first stage to change a threshold voltage of the at least one transistor.

Example aspect 14: The apparatus of any one of example aspects 11-13, wherein:
the tuning circuitry comprises at least one resistor coupled between the at least one current source of the tuning circuitry and a power distribution node.

Example aspect 15: The apparatus of example aspect 14, wherein:
the at least one transistor of the first stage comprises a plus transistor and a minus transistor;
the at least one current source of the tuning circuitry comprises a plus current source and a minus current source;
the at least one resistor of the tuning circuitry comprises a plus resistor and a minus resistor; and
the tuning circuitry comprises:
    a plus switch coupled between the plus resistor and the back-gate terminal of the plus transistor of the first stage and between the plus current source and the back-gate terminal of the plus transistor of the first stage; and
    a minus switch coupled between the minus resistor and the back-gate terminal of the minus transistor of the first stage and between the minus current source and the back-gate terminal of the minus transistor of the first stage.

Example aspect 16: The apparatus of any one of the preceding example aspects, further comprising:
a power detector coupled to a communication chain,
a controller coupled to the power detector and configured to generate a control signal for the tuning circuitry.

Example aspect 17: The apparatus of any one of the preceding example aspects, wherein:
the first stage comprises a transconductance stage of a mixer; and
the second stage comprises a cascode stage of the mixer.

Example aspect 18: An apparatus comprising:
a power detector configured to detect a power level; and
a communication chain comprising:
    a port configured to be coupled to an antenna;
    a mixer circuit comprising:
        a mixer configured to combine a local oscillator signal and an input signal to produce an output signal; and
        tuning circuitry coupled between the mixer and the power detector, the tuning circuitry configured to adjust the output signal based on the power level; and
    an amplifier coupled between the mixer circuit and the port,
the power detector coupled to the communication chain between the amplifier and the port.

Example aspect 19: The apparatus of example aspect 18, wherein the tuning circuitry is configured to:
adjust the output signal of the mixer to reduce the power level detected by the power detector along the communication chain between the amplifier and the port.

Example aspect 20: The apparatus of example aspect 18 or 19, wherein the tuning circuitry is configured to:
inject at least one current into the mixer to adjust the output signal of the mixer based on the power level detected by the power detector.

Example aspect 21: The apparatus of any one of example aspects 18-20, wherein the tuning circuitry is configured to:
change at least one voltage level of a back-gate terminal of at least one transistor to adjust the output signal of the mixer.

Example aspect 22: The apparatus of any one of example aspects 18-21, further comprising:
controller circuitry coupled between the power detector and the tuning circuitry, the controller circuitry configured to:
    cause the input signal of the mixer to be substantially zero;
    couple to the mixer the local oscillator signal having a frequency;
    operate the power detector to detect the power level while the local oscillator signal has the frequency and the input signal is substantially zero; and
    establish one or more settings for the tuning circuitry.

Example aspect 23: The apparatus of example aspect 22, wherein:
the controller circuitry is configured to establish the one or more settings for the tuning circuitry to substantially reduce an amount of the local oscillator signal from a local oscillator that is within the communication chain.

Example aspect 24: The apparatus of example aspect 22 or 23, further comprising:
at least one register coupled to the tuning circuitry, wherein:
the controller circuitry is configured to establish the one or more settings for the tuning circuitry by programming the at least one register with at least one value based on the power level detected by the power detector; and
the tuning circuitry is configured to use the at least one value of the at least one register to counteract feedthrough of the local oscillator signal from the mixer along at least a portion of the communication chain.

Example aspect 25: The apparatus of any one of example aspects 22-24, wherein:
the power level detected by the power detector represents feedthrough of the local oscillator signal from the mixer along at least a portion of the communication chain.

Example aspect 26: The apparatus of any one of example aspects 18-25, wherein:
the mixer is configured to convert an input frequency of the input signal to an output frequency of the output signal based on a frequency of the local oscillator signal.

Example aspect 27: The apparatus of any one of example aspects 18-26, wherein:
the communication chain comprises a receive chain; and
the mixer is configured to perform frequency down-conversion.

Example aspect 28: The apparatus of any one of example aspects 18-26, wherein:
the communication chain comprises a transmit chain; and
the mixer is configured to perform frequency up-conversion.

Example aspect 29: The apparatus of example aspect 28, further comprising:
a wireless interface device comprising the transmit chain and the power detector;
a display screen; and
at least one processor operatively coupled to the display screen and at least a portion of the wireless interface device, the at least one processor configured to present one or more graphical images on the display screen based on one or more wireless signals communicated using the mixer circuit of the wireless interface device.

Example aspect 30: A method for mixer calibration, the method comprising:
operating a mixer to produce an output signal based on an input signal and a local oscillator signal;
propagating the output signal through one or more components;
adjusting the output signal to produce an adjusted signal using at least one component of the one or more components;
detecting a power level associated with the adjusted signal to obtain a detected power level; and
calibrating the operating of the mixer based on the detected power level.

Example aspect 31: The method of example aspect 30, wherein the operating comprises:
mixing the input signal having a substantially zero magnitude and the local oscillator signal to produce the output signal having a magnitude indicative of a feedthrough of the local oscillator signal from the mixer to the one or more components.

Example aspect 32: The method of example aspect 30 or 31, wherein the calibrating comprises:
calibrating the operating of the mixer to reduce the detected power level.

Example aspect 33: The method of example aspect 32, wherein the calibrating comprises:
iteratively adjusting a current-based digital-to-analog converter (IDAC) to substantially minimize the detected power level.

Example aspect 34: The method of example aspect 33, wherein the iteratively adjusting comprises:
storing a value in association with a frequency or frequency band corresponding to the local oscillator signal.

Example aspect 35: The method of any one of example aspects 30-34, wherein the calibrating comprises:
injecting at least one current into the mixer to adjust the output signal based on the detected power level.

Example aspect 36: The method of any one of example aspects 30-35, wherein the calibrating comprises:
changing a level of a voltage of a back-gate terminal of at least one transistor to adjust the output signal based on the detected power level.

Example aspect 37: An apparatus for mixer calibration, the apparatus comprising:
means for mixing an input signal and a local oscillator signal to produce an output signal;
means for propagating the output signal along a communication chain;
means for detecting a power level of the output signal based on the means for propagating; and
means for adjusting the output signal to tune the means for mixing based on the power level to decrease a feedthrough of the local oscillator signal.

Example aspect 38: The apparatus of example aspect 37, wherein the means for adjusting comprises:
means for injecting at least one current into the means for mixing to adjust the output signal to reduce the power level.

Example aspect 39: The apparatus of example aspect 37 or 38, wherein the means for adjusting comprises:
means for changing a voltage level of a back-gate terminal of the means for mixing to adjust the output signal to reduce the power level.

Example aspect 40: An apparatus comprising:
a mixer circuit comprising:
a first stage comprising at least one transistor coupled between a mixer input and a mixer output, the at least one transistor comprising a gate terminal and a back-gate terminal, the gate terminal of the at least one transistor corresponding to the mixer input;
a second stage comprising one or more transistors coupled between the at least one transistor of the first stage and the mixer output, the one or more transistors coupled between a local oscillator signal input and the mixer output; and
tuning circuitry comprising at least one current source coupled to the back-gate terminal of the at least one transistor.

Example aspect 41: The apparatus of example aspect 40, wherein:
the mixer output comprises a plus mixer output and a minus mixer output;
the at least one transistor of the first stage comprises:
a plus transistor coupled between a power distribution node and the second stage via channel terminals of the plus transistor; and
a minus transistor coupled between the power distribution node and the second stage via channel terminals of the minus transistor; and
the one or more transistors of the second stage comprise:
a first plus transistor coupled between the plus transistor and the plus mixer output via channel terminals of the first plus transistor;
a first minus transistor coupled between the minus transistor and the plus mixer output via channel terminals of the first minus transistor;
a second plus transistor coupled between the minus transistor and the minus mixer output via channel terminals of the second plus transistor; and
a second minus transistor coupled between the plus transistor and the minus mixer output via channel terminals of the second minus transistor.

CONCLUSION

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire, or an electromagnetic coupling, such as with a transformer. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The term "node" (e.g., including a "first node" or a "local oscillator node") represents at least a point of electrical connection between two or more components (e.g., circuit elements). Although at times a node may be visually depicted in a drawing as a single point, the node can represent a connection portion of a physical circuit or network that has approximately a same voltage potential at or along the connection portion between two or more components. In other words, a node can represent at least one of multiple points along a conducting medium (e.g., a wire or trace) that exists between electrically connected components. Similarly, a "terminal" or "port" may represent one or more points with at least approximately a same voltage potential relative to an input or output of a component (e.g., a transistor).

The terms "first," "second," "third," and other numeric-related indicators are used herein to identify or distinguish similar or analogous items from one another within a given context-such as a particular implementation, a single drawing figure, a given component, or a claim. Thus, a first item in one context may differ from a first item in another context. For example, an item identified as a "first node" in one context may be identified as a "second node" in another context. Similarly, a "first resistor" or a "first switch" in one claim may be recited as a "second resistor" or a "third switch," respectively, in a different claim (e.g., in separate claim sets). An analogous interpretation applies to differential-related terms such as a "plus resistor" and a "minus resistor."

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Although implementations for oscillator feedthrough calibration have been described in language specific to certain features and/or methods, the subject of the appended claims is not necessarily limited to the specific features or methods described. Rather, the specific features and methods are disclosed as example implementations for oscillator feedthrough calibration.

What is claimed is:

1. An apparatus comprising:
a mixer circuit comprising:
a first stage comprising at least one transistor coupled between a mixer input and a mixer output;
a second stage comprising one or more transistors coupled between the at least one transistor of the first stage and the mixer output, the one or more transistors coupled between a local oscillator signal input and the mixer output; and
tuning circuitry comprising at least one current source coupled to the at least one transistor of the first stage, wherein
the at least one transistor of the first stage comprises a gate terminal and a back-gate terminal;
the gate terminal of the at least one transistor corresponds to the mixer input; and
the at least one current source of the tuning circuitry is coupled to the back-gate terminal of the at least one transistor.

2. The apparatus of claim 1, wherein:
the tuning circuitry comprises a current-based digital-to-analog converter (IDAC).

3. The apparatus of claim 1, wherein the tuning circuitry comprises:
multiple current sources including the at least one current source of the tuning circuitry;
multiple switches, each switch of the multiple switches respectively coupled to a current source of the multiple current sources; and
another switch coupled to the at least one transistor.

4. The apparatus of claim 3, further comprising:
at least one register coupled to the multiple switches, the at least one register comprising multiple bits, each bit of the multiple bits respectively corresponding to a switch of the multiple switches.

5. The apparatus of claim 4, wherein:
the at least one register comprises another bit corresponding to the other switch; and
the other switch of the tuning circuitry is coupled between the at least one current source of the tuning circuitry and the at least one transistor of the first stage.

6. The apparatus of claim 1, wherein:
the at least one current source of the tuning circuitry is configured to apply at least one current to at least one node corresponding to the back-gate terminal of the at least one transistor of the first stage to adjust a level of a voltage at the at least one node.

7. The apparatus of claim 6, wherein:
the tuning circuitry is configured, by adjusting the level of the voltage at the at least one node, to change a level of a voltage of the back-gate terminal of the at least one transistor of the first stage to change a threshold voltage of the at least one transistor.

8. The apparatus of claim 1, wherein:
the tuning circuitry comprises at least one resistor coupled between the at least one current source of the tuning circuitry and a power distribution node.

9. The apparatus of claim 8, wherein:
the at least one transistor of the first stage comprises a plus transistor and a minus transistor;
the at least one current source of the tuning circuitry comprises a plus current source and a minus current source;
the at least one resistor of the tuning circuitry comprises a plus resistor and a minus resistor; and
the tuning circuitry comprises:
a plus switch coupled between the plus resistor and the back-gate terminal of the plus transistor of the first stage and between the plus current source and the back-gate terminal of the plus transistor of the first stage; and
a minus switch coupled between the minus resistor and the back-gate terminal of the minus transistor of the first stage and between the minus current source and the back-gate terminal of the minus transistor of the first stage.

10. The apparatus of claim 1, further comprising:
a power detector coupled to a communication chain,
a controller coupled to the power detector and configured to generate a control signal for the tuning circuitry.

11. The apparatus of claim 1, wherein:
the first stage comprises a transconductance stage of a mixer; and
the second stage comprises a cascode stage of the mixer.

12. An apparatus comprising:
a power detector configured to detect a power level; and
a communication chain comprising:
a port configured to be coupled to an antenna;
a mixer circuit comprising:
a mixer configured to combine a local oscillator signal and an input signal to produce an output signal; and
tuning circuitry coupled between the mixer and the power detector, the tuning circuitry configured to adjust the output signal based on the power level; and
an amplifier coupled between the mixer circuit and the port,
the power detector coupled to the communication chain between the amplifier and the port.

13. The apparatus of claim 12, wherein the tuning circuitry is configured to:
inject at least one current into the mixer to adjust the output signal of the mixer based on the power level detected by the power detector.

14. The apparatus of claim 12, wherein the tuning circuitry is configured to:
change at least one voltage level of a back-gate terminal of at least one transistor to adjust the output signal of the mixer.

15. The apparatus of claim 12, further comprising:
controller circuitry coupled between the power detector and the tuning circuitry, the controller circuitry configured to:
cause the input signal of the mixer to be substantially zero;
couple to the mixer the local oscillator signal having a frequency;

operate the power detector to detect the power level while the local oscillator signal has the frequency and the input signal is substantially zero; and establish one or more settings for the tuning circuitry.

16. The apparatus of claim 15, wherein:

the controller circuitry is configured to establish the one or more settings for the tuning circuitry to substantially reduce an amount of the local oscillator signal from a local oscillator that is within the communication chain.

17. The apparatus of claim 15, further comprising:

at least one register coupled to the tuning circuitry, wherein:

the controller circuitry is configured to establish the one or more settings for the tuning circuitry by programming the at least one register with at least one value based on the power level detected by the power detector; and the tuning circuitry is configured to use the at least one value of the at least one register to counteract feedthrough of the local oscillator signal from the mixer along at least a portion of the communication chain.

18. The apparatus of claim 15, wherein:

the power level detected by the power detector represents feedthrough of the local oscillator signal from the mixer along at least a portion of the communication chain.

19. The apparatus of claim 12, wherein:

the mixer is configured to convert an input frequency of the input signal to an output frequency of the output signal based on a frequency of the local oscillator signal.

20. The apparatus of claim 12, wherein:

the communication chain comprises a transmit chain; and the mixer is configured to perform frequency up-conversion.

21. The apparatus of claim 20, further comprising:

a wireless interface device comprising the transmit chain and the power detector;

a display screen; and at least one processor operatively coupled to the display screen and at least a portion of the wireless interface device, the at least one processor configured to present one or more graphical images on the display screen based on one or more wireless signals communicated using the mixer circuit of the wireless interface device.

22. A method for mixer calibration, the method comprising:

operating a mixer to produce an output signal based on an input signal and a local oscillator signal;

propagating the output signal through one or more components;

adjusting the output signal to produce an adjusted signal using at least one component of the one or more components;

detecting a power level associated with the adjusted signal to obtain a detected power level; and calibrating the operating of the mixer based on the detected power level.

23. An apparatus comprising:

a mixer circuit comprising:

a first stage comprising at least one transistor coupled between a mixer input and a mixer output, the at least one transistor comprising a gate terminal and a back-gate terminal, the gate terminal of the at least one transistor corresponding to the mixer input;

a second stage comprising one or more transistors coupled between the at least one transistor of the first stage and the mixer output, the one or more transistors coupled between a local oscillator signal input and the mixer output; and tuning circuitry comprising at least one current source coupled to the back-gate terminal of the at least one transistor.

24. The apparatus of claim 23, wherein:

the mixer output comprises a plus mixer output and a minus mixer output;

the at least one transistor of the first stage comprises:

a plus transistor coupled between a power distribution node and the second stage via channel terminals of the plus transistor; and a minus transistor coupled between the power distribution node and the second stage via channel terminals of the minus transistor; and the one or more transistors of the second stage comprise:

a first plus transistor coupled between the plus transistor and the plus mixer output via channel terminals of the first plus transistor;

a first minus transistor coupled between the minus transistor and the plus mixer output via channel terminals of the first minus transistor;

a second plus transistor coupled between the minus transistor and the minus mixer output via channel terminals of the second plus transistor; and a second minus transistor coupled between the plus transistor and the minus mixer output via channel terminals of the second minus transistor.

* * * * *